US009378981B2

(12) United States Patent
Takechi et al.

(10) Patent No.: US 9,378,981 B2
(45) Date of Patent: Jun. 28, 2016

(54) THIN FILM DEVICE AND MANUFACTURING METHOD THEREOF

(71) Applicants: Kazushige Takechi, Kanagawa (JP); Shinnosuke Iwamatsu, Yamagata (JP); Seiya Kobayashi, Yamagata (JP); Yoshiyuki Watanabe, Yamagata (JP); Toru Yahagi, Yamagata (JP)

(72) Inventors: Kazushige Takechi, Kanagawa (JP); Shinnosuke Iwamatsu, Yamagata (JP); Seiya Kobayashi, Yamagata (JP); Yoshiyuki Watanabe, Yamagata (JP); Toru Yahagi, Yamagata (JP)

(73) Assignee: NLT TECHNOLOGIES, LTD., Kanagawa (JP)

( * ) Notice: Subject to any disclaimer, the term of this patent is extended or adjusted under 35 U.S.C. 154(b) by 0 days.

(21) Appl. No.: 14/687,459

(22) Filed: Apr. 15, 2015

(65) Prior Publication Data

US 2015/0279698 A1   Oct. 1, 2015

Related U.S. Application Data

(62) Division of application No. 13/585,441, filed on Aug. 14, 2012, now Pat. No. 9,048,319.

(30) Foreign Application Priority Data

Aug. 15, 2011   (JP) .................................. 2011-177614

(51) Int. Cl.
*H01L 29/786* (2006.01)
*H01L 21/46* (2006.01)
(Continued)

(52) U.S. Cl.
CPC .............. *H01L 21/46* (2013.01); *H01L 21/441* (2013.01); *H01L 29/401* (2013.01); *H01L 29/66969* (2013.01); *H01L 29/7869* (2013.01); *H01L 29/78609* (2013.01); *H01L 29/78696* (2013.01)

(58) Field of Classification Search
CPC ....... H01L 29/00; H01L 29/786; H01L 27/12; H01L 23/31; H01L 29/40; H01L 29/66; H01L 29/66969; H01L 29/7869; H01L 29/401; H01L 21/34; H01L 21/46; H01L 21/441; H01L 21/336; H01L 21/02554; H01L 21/02565; H01L 21/02667; H01L 27/1225
USPC ....................................... 438/104, 754, 85, 86
See application file for complete search history.

(56) References Cited

U.S. PATENT DOCUMENTS

2008/0296568 A1*  12/2008  Ryu et al. ......................... 257/43
2010/0109058 A1    5/2010  Sakata et al.
(Continued)

FOREIGN PATENT DOCUMENTS

JP      2001-271168 A     10/2001
JP      2006-286536 A     10/2006
(Continued)

OTHER PUBLICATIONS

Kenji Nomura, et al., "Room-temperature fabrication of transparent flexible thin-film transistors using amorphous oxide semiconductors", Nature, Nov. 25, 2004, pp. 488-492, vol. 432.
(Continued)

*Primary Examiner* — Chuong A Luu
(74) *Attorney, Agent, or Firm* — Sughrue Mion, PLLC

(57) ABSTRACT

With a TFT using an oxide semiconductor film, there is such an issue that oxygen deficit is generated in a surface region of the oxide semiconductor film after performing plasma etching of a source/drain electrode, thereby increasing the off-current. Provided is a TFT which includes: a gate electrode on an insulating substrate; a gate insulating film on the gate electrode; an oxide semiconductor film containing indium on the gate insulating film; and a source/drain electrode on the oxide semiconductor film. Further, the peak position derived from an indium 3d orbital in the XPS spectrum of a surface layer in a part of the oxide semiconductor film where the source/drain electrode is not superimposed is shifted towards a high energy side than the peak position derived from the indium 3d orbital in the XPS spectrum of an oxide semiconductor region existing in a lower part of the surface layer.

3 Claims, 35 Drawing Sheets

(51) Int. Cl.
*H01L 21/441* (2006.01)
*H01L 29/40* (2006.01)
*H01L 29/66* (2006.01)

(56) References Cited

U.S. PATENT DOCUMENTS

| | | | |
|---|---|---|---|
| 2011/0133176 A1 | 6/2011 | Lee et al. | |
| 2011/0215325 A1* | 9/2011 | Yamazaki et al. | 257/57 |
| 2011/0259420 A1* | 10/2011 | Yamazaki et al. | 136/259 |
| 2012/0244659 A1 | 9/2012 | Imoto et al. | |

FOREIGN PATENT DOCUMENTS

| | | |
|---|---|---|
| JP | 2009-260378 A | 11/2009 |
| JP | 2010-056539 A | 3/2010 |
| JP | 2010-056542 A | 3/2010 |
| JP | 2010-097204 A | 4/2010 |
| JP | 2010-267955 A | 11/2010 |
| JP | 2011-100982 A | 5/2011 |
| WO | 2008/136505 A1 | 11/2008 |

OTHER PUBLICATIONS

Chang-Jung Kim, et al., "Characteristics and Cleaning of Dry-Etching-Damaged Layer of Amorphous Oxide Thin-Film Transistor", Electrochemical and Solid-State Letters, 2009, H95-H97, vol. 12, No. 4.

Hideya Kumomi, et al., "Materials, Devices, and Circuits of Transparent Amorphous-Oxide Semiconductor", Journal of Display Technology, Dec. 2009, vol. 5, No. 12.

Toshiaki Arai, et al., "69.2: Highly Reliable Oxide-Semiconductor TFT for AM-OLED Display", SID 10 Digest, 2010, pp. 1033-1036.

Communication dated Jul. 7, 2015 from the Japanese Patent Office in counterpart application No. 2011-177614.

* cited by examiner

THIN FILM DEVICE AND MANUFACTURING METHOD THEREOF

CROSS-REFERENCE TO RELATED APPLICATION

This application is a divisional of U.S. patent application Ser. No. 13/585,441, filed Aug. 14, 2012 now U.S. Pat. No. 9,048,319, based upon and claims the benefit of priority from Japanese patent application No. 2011-177614, filed on Aug. 15, 2011, the disclosure of which is incorporated herein in its entirety by reference.

BACKGROUND OF THE INVENTION

1. Field of the Invention

The present invention relates to a thin film device such as an oxide semiconductor thin film transistor which uses an oxide semiconductor film as an active layer and to a manufacturing method thereof. Hereinafter, the thin film transistor is referred to as "TFT", and an oxide semiconductor composed mainly of indium (In), gallium (Ga), zinc (Zn), and oxygen (O) is referred to as "IGZO (In—Ga—Zn—O)".

2. Description of the Related Art

Regarding a TFT in which the oxide semiconductor containing indium is used for the active layer, the field-effect mobility is higher than that of a conventional amorphous silicon TFT for about one digit. Further, the band gap of the oxide semiconductor film is 3 eV or more, so that it is transparent for visible light. Thus, an increase in the off-current at the time of irradiating visible light is extremely small with the oxide semiconductor film. Therefore, TFT with a high on-off ratio can be acquired. By using such characteristic, researches and developments of high-performance liquid crystal displays and organic EL displays using the oxide semiconductor TFT for the pixel drive element are being conducted broadly.

It is also a characteristic of the oxide semiconductor film to have a variety of compositions, so that researches and developments of various oxide semiconductor films such as an IGZO film, a Zn—O film, an In—Si—O film, and a Zn—Sn—O film are being conducted. While there are searches for various materials being conducted, those containing at least either indium (In) or zinc (Zn) are the mainstreams as the oxide semiconductor films which can provide a fine TFT characteristic. Particularly, in order to achieve a high field-effect mobility of about 10 cm$^2$/Vs, the oxide semiconductor film containing indium is effective.

Further, there is also a possibility that a fine thin film is created at a low temperature with the oxide semiconductor film compared to the case of using a silicon-based thin film. It has also been tried to achieve a flexible display by forming an oxide semiconductor TFT on a plastic substrate by utilizing the low-temperature film deposition.

Next, documents of conventional techniques will be described as the related techniques.

Regarding the TFT using the oxide semiconductor film, Nomura, et al. first reported the TFT using an IGZO film as the semiconductor active layer (Nomura, et al., Nature, vol. 432, p. 488, (2004): Non-Patent Document 1). This document reports a method which employs plasma etching by using a fluorine-based gas as a patterning method of a source/drain metal electrode of an oxide semiconductor TFT.

C-J. Kim, et al. created an oxide semiconductor TFT using an IGZO film as an active layer through etching a source/drain electrode constituted with Ti by using mixed gas plasma of an Ar gas and an SF$_6$ gas (C-J. Kim, et al., Electrochemical and Solid-State Letters, Vol. 12, H95, (2009): Non-Patent Document 2). In this Document, it is disclosed that the off-current of the TFT is increased dramatically since an oxygen deficit layer is formed on the top face (back channel of the TFT) of the IGZO thin film at the time where the source/drain electrode constituted with Ti is etched. Further, existence of the oxygen deficient layer, i.e., InOx is confirmed because of the fact that the peak derived from In3d is shifted towards the low energy side from the peak position derived from In$_2$O$_3$ as a result of the analysis conducted by XPS (X-ray Photoelectron Spectroscopy). Further, it is also disclosed that it is necessary to perform etching to remove the oxygen deficit layer by a hydrochloric acid solution in order to decrease the increased off-current.

Further, Kumomi, et al. reports an IGZO oxide semiconductor TFT using a source/drain electrode constituted with Mo (Kumomi et al., Journal of Display Technology, vol. 5, 531 (2009): Non-Patent Document 3). In this Document, it is depicted that a granular surface layer remains on a back channel surface after etching the source/drain electrode constituted with Mo by using CF$_4$ gas plasma and that this may be a cause for the instability of the TFT characteristic. A stable characteristic is achieved by removing the surface layer through performing etching also with a hydrochloric acid solution.

T. Arai, et al. report that there is an interface layer existing in the interface between an oxide semiconductor film and a source/drain electrode (T. Arai, et al., SID' 10 Technical Digest, 69-2, (2010): Non-Patent Document 4). This Document discloses that an IGZO layer where oxygen is lost exists along with a TiOx layer in the interface between Ti as the source/drain electrode and an IGZO film as an oxide semiconductor film. However, nothing is mentioned therein regarding the surface layer of the IGZO film surface.

Etching of the source/drain electrode of the oxide semiconductor TFT is disclosed in Japanese Unexamined Patent Publication 2009-260378 (Patent Document 1). This Document discloses a manufacturing method which performs etching of an oxide semiconductor TFT channel with a gas containing fluorine or chlorine. However, nothing is mentioned therein regarding the surface layer of the etched oxide semiconductor film, and the surface layer is not controlled.

Japanese Unexamined Patent Publication 2010-056542 (Patent Document 2) and Japanese Unexamined Patent Publication 2010-056539 (Patent Document 3) also disclose the structure where the interface layer exists in the interface between the oxide semiconductor film and the source/drain electrode. Those Documents disclose the structure where a buffer layer of high carrier density exists in the interface between the source/drain electrode and the IGZO film. The buffer layer is a layer formed with an IGZO film with a high oxygen deficit density and an alloy of the IGZO film and the source-drain metal, which is achieved by being deposited individually.

Among the oxide semiconductors containing indium, currently the most widely used material is IGZO (InGaZnO$_4$). This material is constituted with a compound of indium oxide In$_2$O$_3$, gallium oxide Ga$_2$O$_3$ and zinc oxide Zno.

In the report (Non-Patent Document 2) of C-J. Kim, et al., plasma of an SF$_6$ gas as a fluorine-based gas is used when patterning Ti that is a metal material for the source/drain electrode deposited on the upper part of the IGZO film. When performing the plasma etching, a substrate is placed on a cathode electrode side of the effective ion etching equipment. In the oxide semiconductor TFT fabricated in this manner, the off-current is increased since an oxygen deficit layer is formed in the vicinity of the back channel as described above. Thus, it is necessary to remove the oxygen deficit layer by performing etching with a hydrochloric acid solution. Existence of such oxygen deficit layer is checked since the In3d peak is shifted towards the low energy side from the regular peak position derived from $In_2O_3$ with no oxygen deficit as a result of the XPS measurement of the IGZO film.

Such etching using the hydrochloric acid solution leads to an increase in the process cost. Also, there is an issue that the yield is dramatically decreased due to over-etching of the IGZO film since selective etching of the Ti electrode and the IGZO oxide semiconductors film is difficult. Such issues also exist in the cases of Non-Patent Document 3 and the like.

As described, with the oxide semiconductor TFT constituted with IGZO, the In3d peak on the surface of the IGZO film is likely to shift towards the low energy side from the normal peak position derived from $In_2O_3$. Thus, how to suppress the shift of the peak towards the low energy side (i.e., how to suppress generation of the oxygen deficit layer) is the important issue. Further, with silicon-based thin film materials, it is possible to achieve a fine ohmic contact characteristic through decreasing the resistance value by doping phosphor or boron into silicon and using those for the source/drain regions. In the meantime, it is difficult to control doping in a case of the oxide semiconductor film unlike the case of silicon, so that it is difficult to achieve a fine ohmic contact characteristic in the source/drain regions. Therefore, it is necessary to form the low-resistance layers individually, for example, as in the cases of Patent Documents 2 and 3, which results in increasing the cost.

SUMMARY OF THE INVENTION

The thin film device according to an exemplary aspect of the invention is a thin film device which includes a gate electrode on a substrate, a gate insulating film on the gate electrode, an oxide semiconductor film containing indium on the gate insulating film, and a source/drain electrode on the oxide semiconductor film, wherein a peak position derived from an indium 3d orbital of an XPS spectrum in a surface layer in a part of the oxide semiconductor film where the source/drain electrode is not superimposed is shifted towards a high energy side than a peak position derived from an indium 3d orbital of an XPS spectrum in an oxide semiconductor region existing in a lower part of the surface layer.

The thin film device manufacturing method according to another exemplary aspect of the invention is a thin film device manufacturing method which includes: forming a gate electrode on a substrate; forming a gate insulating film on the gate electrode; forming an oxide semiconductor film on the gate insulating film; depositing a source/drain electrode metal film on the oxide semiconductor film; and patterning the source/drain electrode metal film by using a plasma gas containing fluorine to form a source/drain electrode, wherein the plasma gas containing the fluorine is generated by an inductive coupling plasma source, and the substrate is placed on an earth potential electrode to perform etching of the source/drain electrode metal film.

DETAILED DESCRIPTION OF THE PREFERRED EMBODIMENTS

Figure 1:
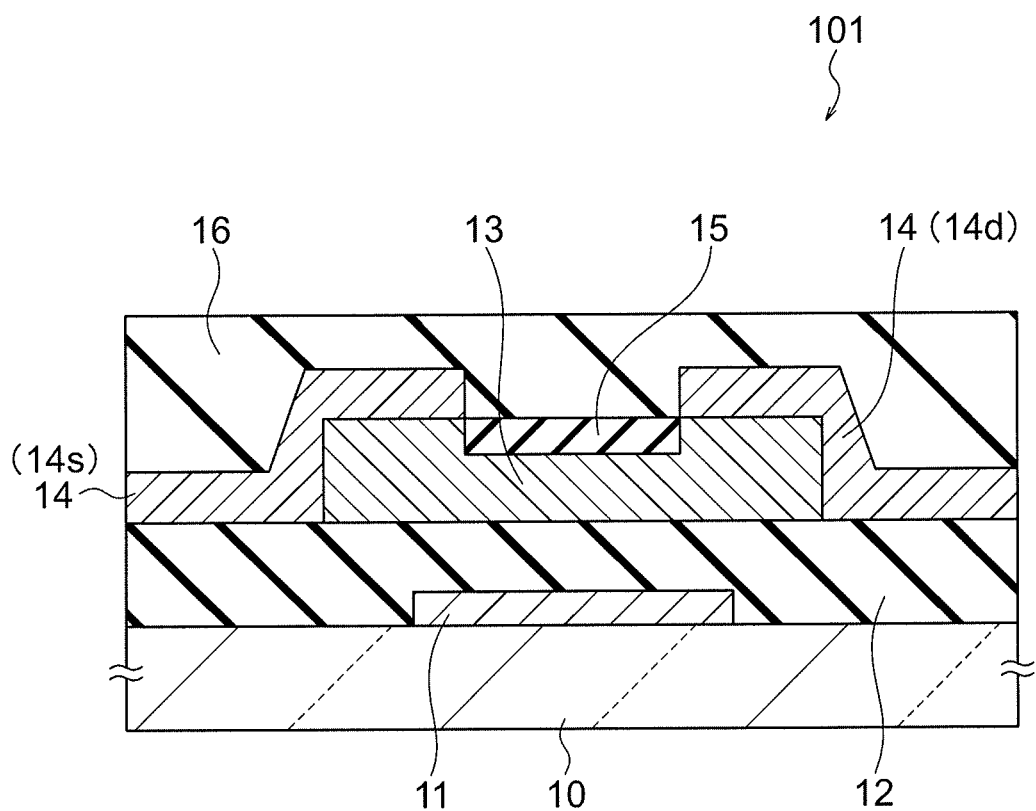
FIG. 1 is a sectional view showing the structure of an oxide semiconductor TFT according to a first exemplary embodiment.

Hereinafter, modes for carrying out the present invention (referred to as "exemplary embodiments" hereinafter) will be described by referring to the accompanying drawings. In this Specification and the drawings, same reference numerals are used for substantially the same structural elements. The shapes in the drawings are illustrated to be easily comprehended by those skilled in the art, and the dimensions and ratios thereof do not necessarily correspond to actual ones. Further, a case where "a second composition element is on a first composition element" includes: a case where "a second composition element is on a first composition element while being in contact with each other"; a case where "another composition element is on a first composition element, and a second composition element is placed thereon further"; a case where "a second composition element is on the entire part of a first composition element"; and a case where "a second composition element is only on a part of a first composition element". Further, in each of the exemplary embodiments, an oxide semiconductor TFT (referred simply to as "TFT" hereinafter) will be described as an example of the thin film device according to the present invention.

(First Exemplary Embodiment)

FIG. 1 is a sectional view showing a TFT according to a first exemplary embodiment. The TFT 101 according to the first exemplary embodiment includes: a gate electrode 11 on an insulating substrate 10 as a substrate; a gate insulating film 12 on the gate electrode 11; an oxide semiconductor film 13 containing indium on the gate insulating film 12; and a source/drain electrode 14 on the oxide semiconductor film 13. Further, the peak position derived from an indium 3d orbital in the XPS spectrum of a surface layer 15 in a part of the oxide semiconductor film 13 where the source/drain electrode 14 is not superimposed (e.g., the oxide semiconductor film 13 between a source electrode 14s and a drain electrode 14d constituting the source/drain electrode 14) is shifted towards a high energy side than the peak position derived from the indium 3d orbital in the XPS spectrum of an oxide semiconductor region existing in a lower part of the surface layer 15.

In other words, the gate electrode 11 is formed on the insulating substrate 10, and the gate insulating film 12 is deposited thereon. The oxide semiconductor film 13 in an island shape containing indium is formed thereon further. The source/drain electrode 14 is formed on the island-shaped oxide semiconductor film 13. The surface layer 15 is formed in the vicinity of the top face of the oxide semiconductor film 13 in the region where the oxide semiconductor film 13 and the source/drain electrode 14 are not superimposed with each other. The point of the first exemplary embodiment is the structure where the peak position derived from an indium 3d orbital in the XPS spectrum of the surface layer 15 is shifted towards a high energy side than the peak position derived from the indium 3d orbital in the XPS spectrum of the oxide semiconductor region existing in a lower part of the surface layer 15. Further, a passivation film 16 is deposited to cover the entire part of the TFT 101.

The first exemplary embodiment will be described in more details by referring to FIG. 1 to FIG. 3.

As shown in FIG. 1, an Al alloy film is deposited on a glass substrate as the insulating substrate 10 by a sputtering method, and the Al alloy film is patterned into a desired shape to form the gate electrode 11. Subsequently, a silicon oxide film as the gate insulating film 12 is deposited by a plasma CVD method. Then, an IGZO film as the oxide semiconductor film 13 is deposited by a sputtering method, and the IGZO film is patterned into a desired island shape. As the oxide semiconductor film 13, it is desirable to contain In. For example, it is possible to use any oxide semiconductor films other than the IGZO film, e.g., an In—Zn—O film, an In—Ga—O film, and an In—Si—O film.

Further, Ti and an Al alloy as the source/drain electrode metal are deposited in this order by a sputtering method. Then, only the Al alloy is removed first by etching. Thereafter, Ti is etched into a desired shape by using fluorine-based gas plasma such as $SF_6$ gas plasma or $CF_4$ gas plasma to form the source/drain electrode 14.

Figure 2:
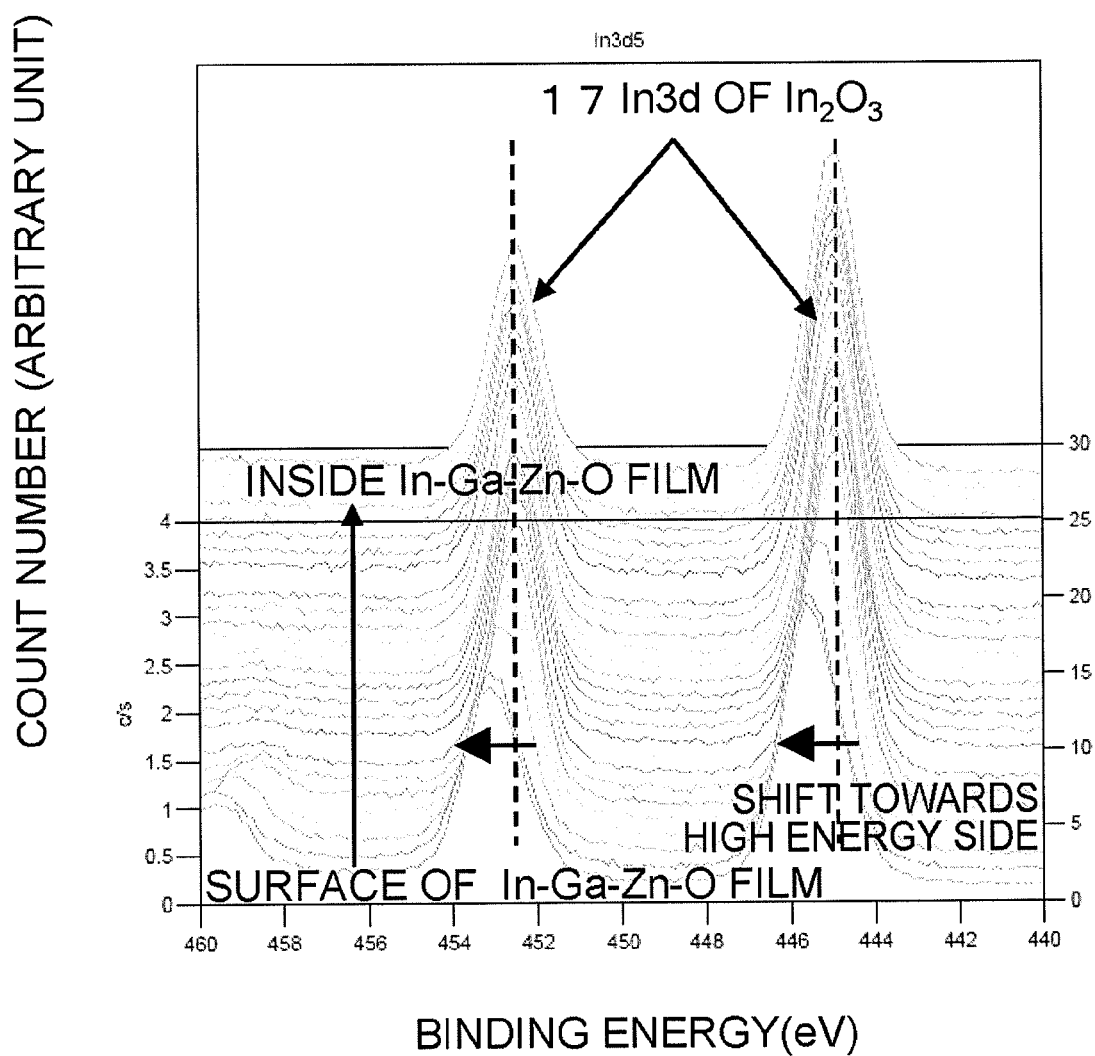
FIG. 2 is a graph showing an XPS spectrum (In3d) with respect to the film thickness direction of an oxide semiconductor film surface of the oxide semiconductor TFT according to the first exemplary embodiment.
Figure 3:
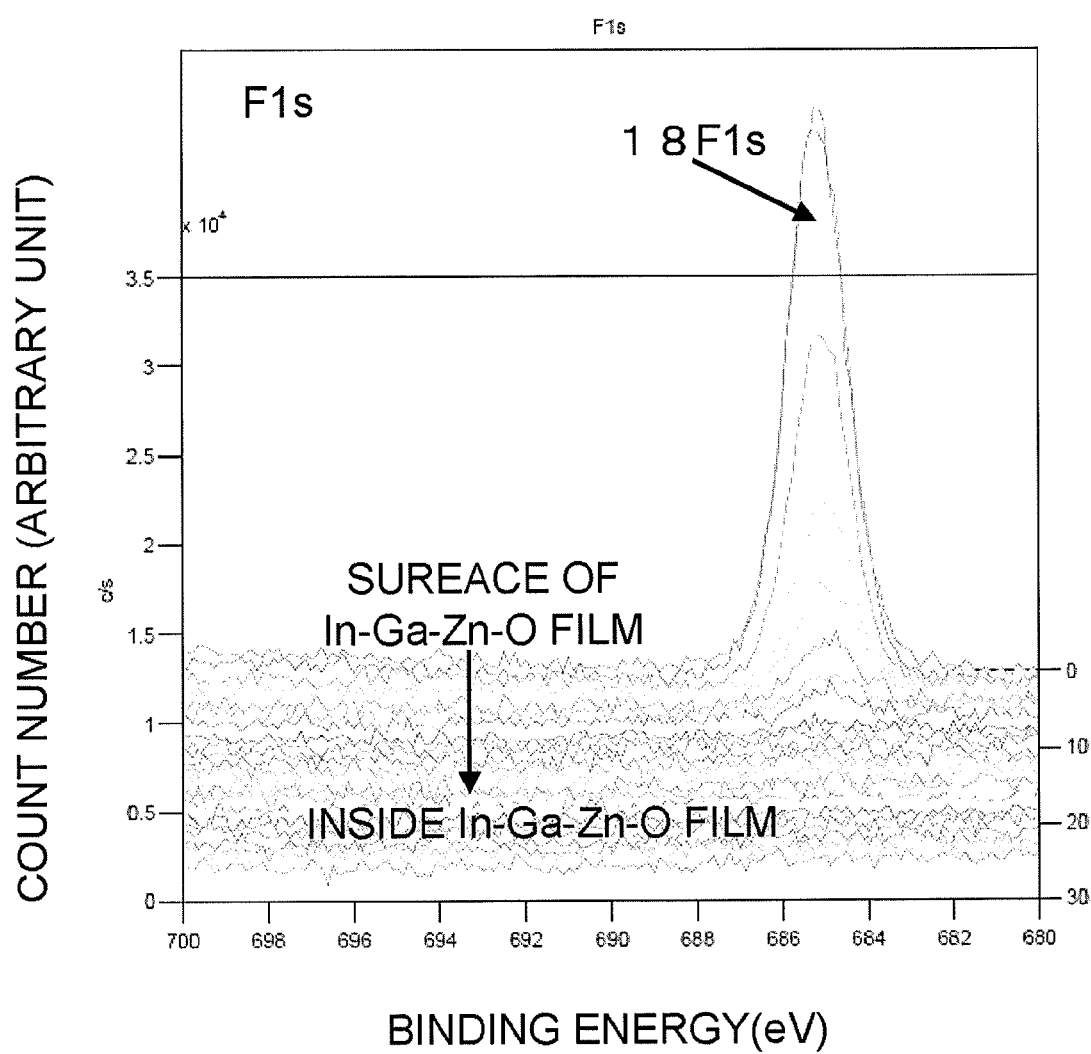
FIG. 3 is a graph showing an XPS spectrum (FIs) with respect to the film thickness direction of the oxide semiconductor film surface of the oxide semiconductor TFT according to the first exemplary embodiment.

The result of the XPS measurement conducted while sputtering the IGZO film by a small amount (by about 2 nm) with an argon gas from the surface side of the IGZO film of the TFT 101 fabricated in the above-described manner is shown in FIG. 2 and FIG. 3.

As shown in FIG. 2, the important point of the first exemplary embodiment is that the surface layer in which the In3d peak is shifted towards the high energy side than a normal peak position 17 derived from $In_2O_3$ exists in the surface of the IGZO film. Further, as shown in FIG. 3, since the surface layer 15 contains fluorine (peak 18 derived from FIs), it is considered that the shift towards the high energy side in FIG. 2 is caused due to the fact that In—O bond on the surface is replaced with In—F bond.

As described, when fluorine and indium are chemically coupled, generation of oxygen deficit on the surface can be suppressed. As a result, an increase in the off-current of the TFT 101 can be suppressed. Further, through providing such surface layer 15, the TFT 101 exhibiting a more stable characteristic for the external environment can be achieved. Specifically, a second gate electrode (a top gate electrode in this case) is provided on the upper part of the passivation film 16, and the transmission characteristic (bottom gate voltage-drain current characteristic) of the transistor was measured while applying a constant voltage to the second gate electrode. Through providing the surface layer 15 described above, the shift amount of the characteristic was suppressed to one half or less of the shift amount of the case without the surface layer 15. To apply the voltage to the second gate electrode equivalently corresponds to a case where impurities such as ions are generated on the passivation film 16. Thus, this result shows that it is possible to suppress the characteristic shift amount for the external impurity charges to one half or less through providing the surface layer 15 and that the stableness of the characteristic is improved.

As an exemplary advantage according to the invention, the present invention is capable of suppressing generation of oxygen depletion on the surface of the oxide semiconductor film. Therefore, it is possible to achieve the thin film device having a fine switching characteristic without etching the surface of the oxide semiconductor film.

(Second Exemplary Embodiment)

Figure 4:
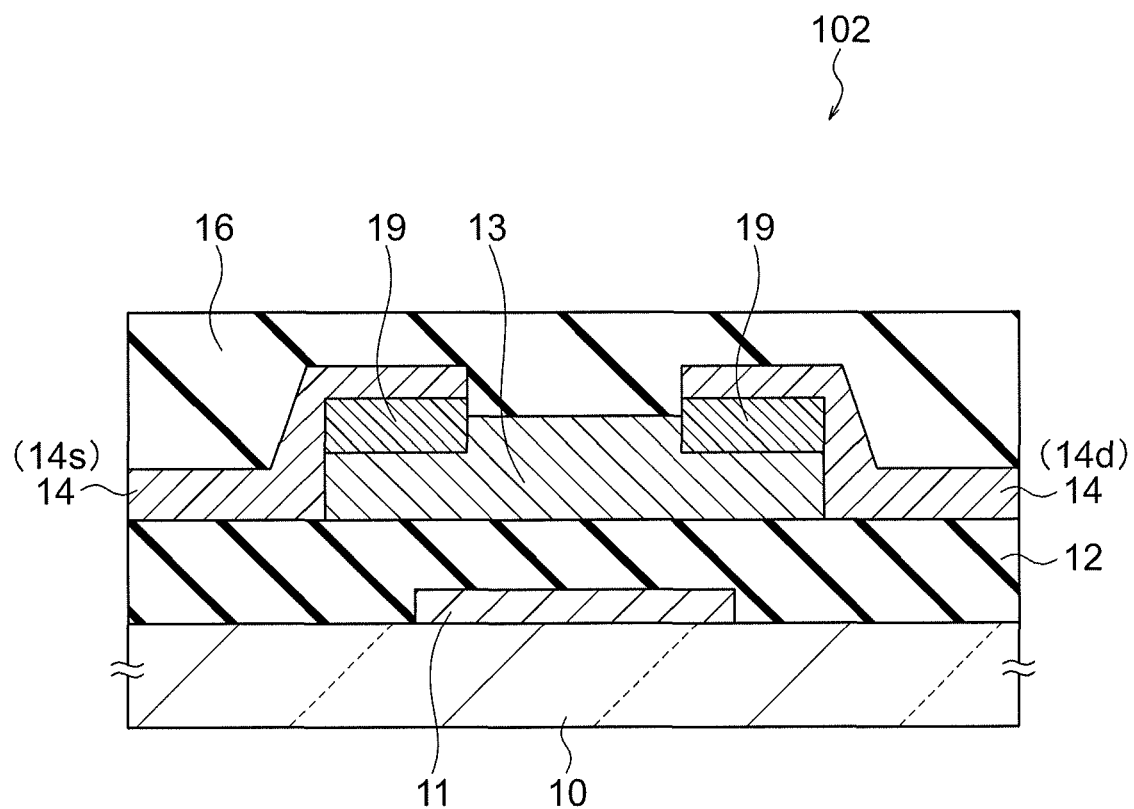
FIG. 4 is a sectional view showing the structure of an oxide semiconductor TFT according to a second exemplary embodiment.

FIG. 4 is a sectional view showing a TFT according to a second exemplary embodiment. The TFT 102 according to the second exemplary embodiment includes: a gate electrode 11 on an insulating substrate 10 as a substrate; a gate insulating film 12 on the gate electrode 11; an oxide semiconductor film 13 containing indium on the gate insulating film 12; and a source/drain electrode 14 on the oxide semiconductor film 13. Further, the peak position derived from an indium 3d orbital in the XPS spectrum of an interface layer 19 existing between the oxide semiconductor film 13 and the source/drain electrode 14 is shifted towards a low energy side than the peak position derived from the indium 3d orbital in the XPS spectrum of an oxide semiconductor region existing in a lower part of the interface layer 19.

In other words, the gate electrode 11 is formed on the insulating substrate 10, and the gate insulating film 12 is deposited thereon. The oxide semiconductor film 13 in an island shape is formed thereon further. The source/drain electrode 14 is formed on the island-shaped oxide semiconductor film 13. The interface layer 19 exists between the oxide semiconductor film 13 and the source/drain electrode 14. The point of the first exemplary embodiment is the structure where the peak position derived from the indium 3d orbital in the XPS spectrum of the interface layer 19 is shifted towards the low energy side than the peak position derived from the indium 3d orbital in the XPS spectrum of the oxide semiconductor region existing in the lower part of the interface layer 19. Further, a passivation film 16 is deposited to cover the entire part of the TFT 102.

The second exemplary embodiment will be described in more details by referring to FIG. 4 and FIG. 5.

As shown in FIG. 4, an Mo alloy film is deposited on a glass substrate as the insulating substrate 10 by a sputtering method, and the Mo alloy film is patterned into a desired shape to form the gate electrode 11. Subsequently, a silicon nitride film and a silicon oxide film as the gate insulating film 12 are deposited in this order by a plasma CVD method. Then, an IGZO film as the oxide semiconductor film 13 is deposited by a sputtering method, and the IGZO film is patterned into a desired island shape. As the oxide semiconductor film 13, it is desirable to contain In. It is possible to use any oxide semiconductor films other than the IGZO film, e.g., an In—Zn—O film, an In—Ga—O film, and an In—Si—O film.

Further, Ti and an Al alloy as the source/drain electrode metal are deposited in this order by a sputtering method. Then, the Al alloy is removed first by etching. Thereafter, Ti is etched into a desired shape by using fluorine-based gas plasma such as $SF_6$ gas plasma or $CF_4$ gas plasma to form the source/drain electrode 14.

Figure 5:
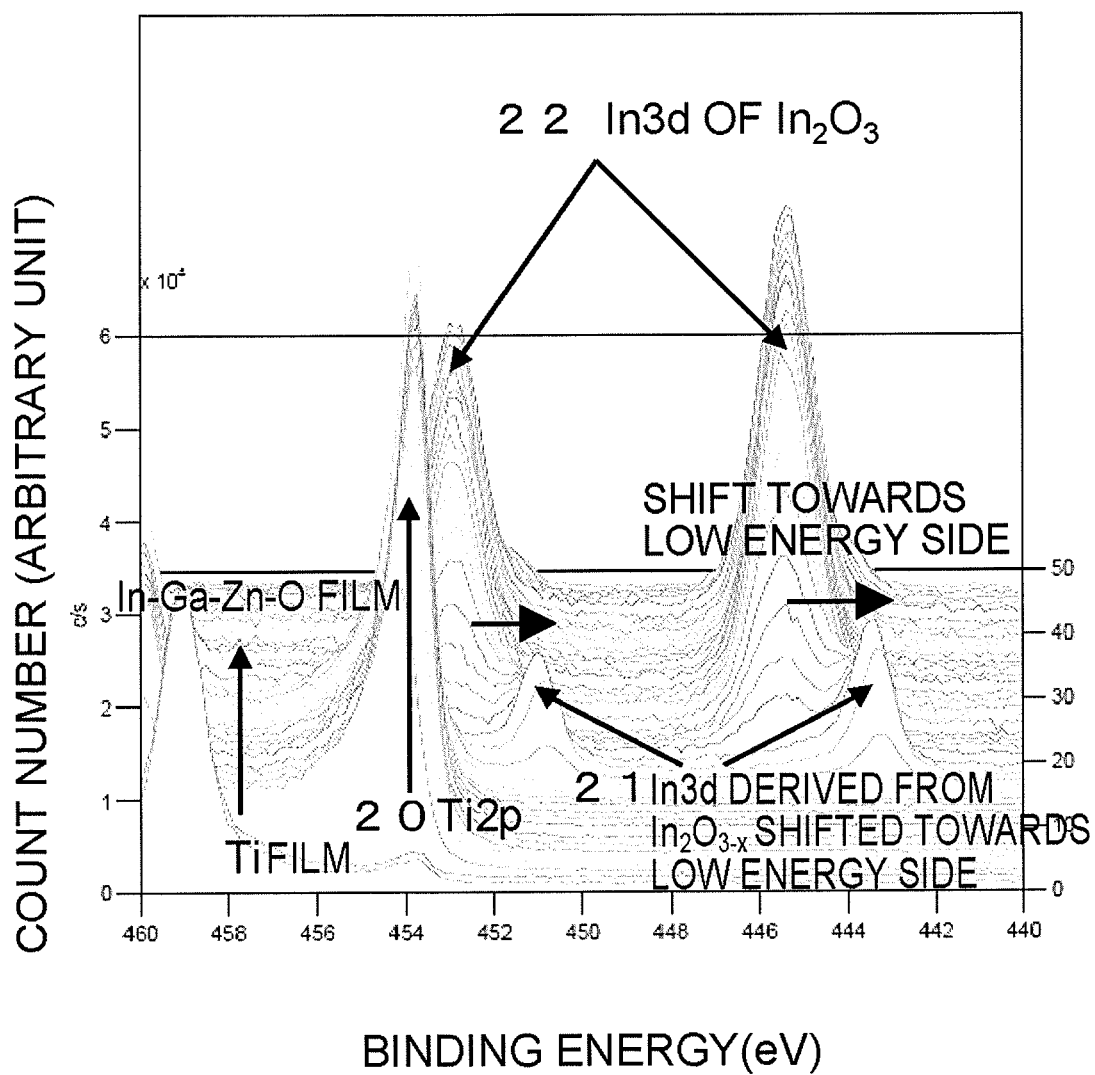
FIG. 5 is a graph showing an XPS spectrum (In3d) with respect to the film thickness direction of the source/drain region of the oxide semiconductor TFT according to the second exemplary embodiment.

The result of the XPS measurement conducted while sputtering the IGZO film by a small amount (by about 2 nm) with an argon gas from the inside of the Ti film of the source/drain electrode 14 of the TFT 102 fabricated in the above-described manner until reaching the inside of the IGZO film is shown in FIG. 5.

As shown in FIG. 5, a peak 20 derived from a Ti2p derived from a metal Ti is observed inside the Ti film. Thereafter, a peak 21 shifted towards the low energy side than the peak position of In3d derived from $In_2O_3$ is observed in the vicinity of the interface between the Ti film and the IGZO film. The peak 21 on the low energy side is derived from oxygen deficit $In_2O_{3-x}$. Further, the peak position of In3d further into the inner side of the IGZO film is a normal peak position 22 derived from $In_2O_3$.

As described, the important point of the second exemplary embodiment is that the peak position derived from In3d in the interface layer 19 between the Ti electrode and the IGZO film is shifted towards the low energy side than the normal In3d peak position of $In_2O_3$. The peak 21 shifted towards the low energy side is a peak derived from $In_2O_3$, generated when oxygen is lost from $In_2O_3$. Further, the second exemplary embodiment shows the case where only the individual peak shifted from In3d peak towards the low energy side exists in the interface layer 19. However, not only the case of such single peak but also a case of an interface layer having the peaks both at the normal position and at the position shifted to the low energy side may be employed as well. That is, it is the point to have the interface layer 19 having at least an XPS signal peak shifted to the low energy side.

Such interface layer 19 can be efficiently formed by setting a film depositing atmosphere to a reduction atmosphere when depositing the source/drain electrode metal. For example, after exhausting to a high vacuum of $5\times10$ Pa, a metal material may be deposited by a sputtering method in a reduction atmosphere of only an Ar gas. Further, before depositing the source/drain electrode metal by sputtering, the oxide semiconductor surface may be reduced by exposing the substrate surface to rare gas plasma or hydrogen plasma such as Ar or He. Alternatively, not only sputtering but also a depositing method such as a vacuum vaporing method or the like may be used.

While the case of using Ti as the source/drain electrode material for the part that comes in contact with the oxide semiconductor film is described in the second exemplary embodiment, it is also possible to use Mo, Cr, Al, Cu, W, and alloys of those.

(Third Exemplary Embodiment)

Figure 6:
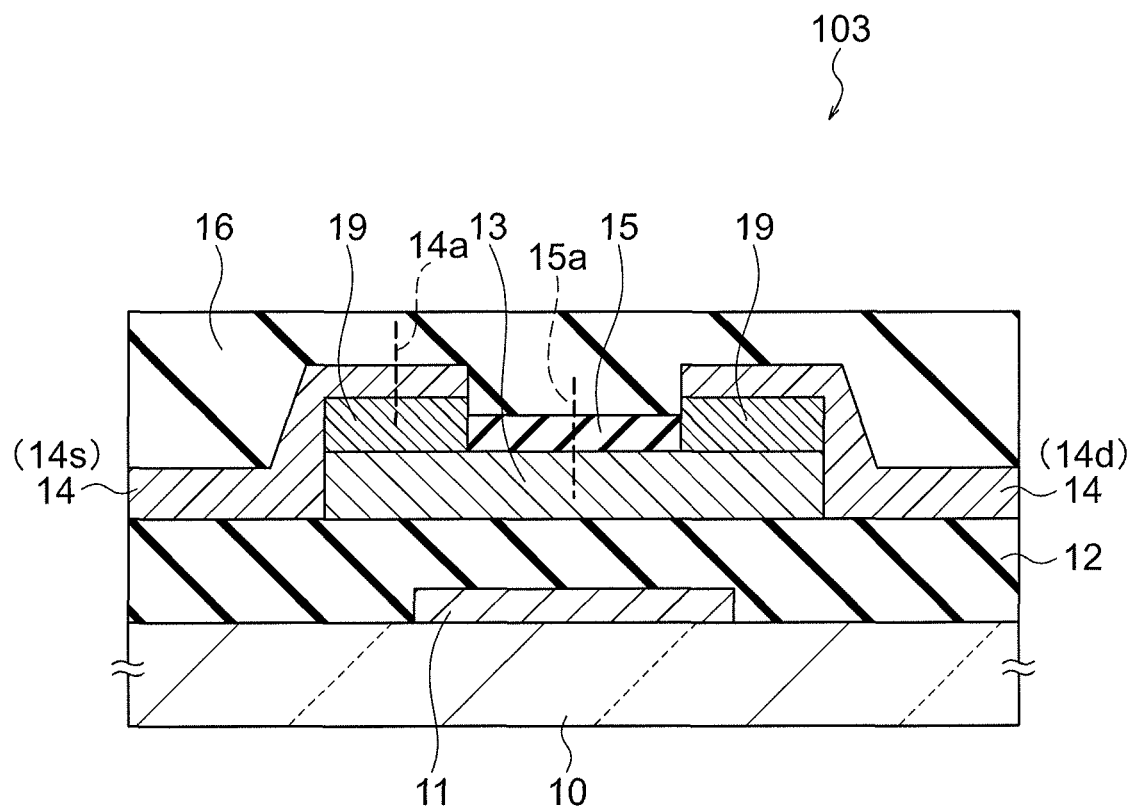
FIG. 6 is a sectional view showing the structure of an oxide semiconductor TFT according to a third exemplary embodiment.

FIG. 6 is a sectional view showing a TFT according to a third exemplary embodiment. The TFT 103 according to the third exemplary embodiment includes: a gate electrode 11 on an insulating substrate 10 as a substrate; a gate insulating film 12 on the gate electrode 11; an oxide semiconductor film 13 containing indium on the gate insulating film 12; and a source/drain electrode 14 on the oxide semiconductor film 13. Further, the peak position derived from an indium 3d orbital in the XPS spectrum of a surface layer 15 in a part of the oxide semiconductor film 13 where the source/drain electrode 14 is not superimposed (e.g., the oxide semiconductor film 13 between a source electrode 14s and a drain electrode 14d constituting the source/drain electrode 14) is shifted towards a high energy side than the peak position derived from the indium 3d orbital in the XPS spectrum of an oxide semiconductor region existing in a lower part of the surface layer 15. Further, the peak position derived from an indium 3d orbital in the XPS spectrum of an interface layer 19 existing between the oxide semiconductor film 13 and the source/drain electrode 14 is shifted towards a low energy side than the peak position derived from the indium 3d orbital in the XPS spectrum of an oxide semiconductor region existing in a lower part of the interface layer 19.

In other words, the TFT 103 of the third exemplary embodiment is in the structure that has both the structure of FIG. 1 and the structure of FIG. 4, which includes both the surface layer 15 in which the peak derived from In3d is shifted towards the high energy side and the interface layer 19 in which the peak derived from In3d is shifted towards the low energy side. The structure of the third exemplary embodiment can be fabricated by combining the manufacturing methods depicted in the first and second exemplary embodiments. The XPS spectrum along "broken line 15a of the surface layer" in FIG. 6 is the same as those of FIG. 2 and FIG. 3, and the XPS spectrum along "broken line 14a of the source/drain region" is the same as that of FIG. 5.

In the first to third exemplary embodiments, described is the structure (channel etching type structure) in which the channel is formed by separating the source and drain through patterning the metal deposited on the upper part of the oxide semiconductor film 13 into the shape of the source/drain electrode 14 by etching. However, the present invention is not limited only to such channel etching type structure. The present invention can also be applied to a structure (channel protection type structure) in which a channel protection insulating film is formed in a desired shape on the oxide semiconductor film, and a source/drain electrode metal material is deposited and patterned thereafter to separate the source and drain, for example.

(Fourth Exemplary Embodiment)

Figure 7A:
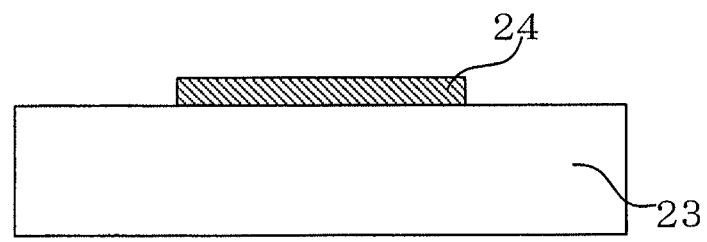
FIGS. 7A, 7B and 7C show first sectional view showing an oxide semiconductor TFT manufacturing method according to a fourth exemplary embodiment, and steps are executed in order of FIG. 7A, FIG. 7B, and FIG. 7C.

The TFT structure of a bottom gate structure according to a fourth exemplary embodiment and manufacturing steps thereof will be described by referring to FIG. 7A to FIG. 19. First, as shown in FIG. 7A, after depositing a Cr metal film to be the gate electrode in a thickness of 50 nm on a glass substrate as an insulating substrate 23 by a sputtering method, the Cr metal film was patterned into a shape of a gate electrode 24 by using a photolithography method or a wet etching method.

Figure 7B:
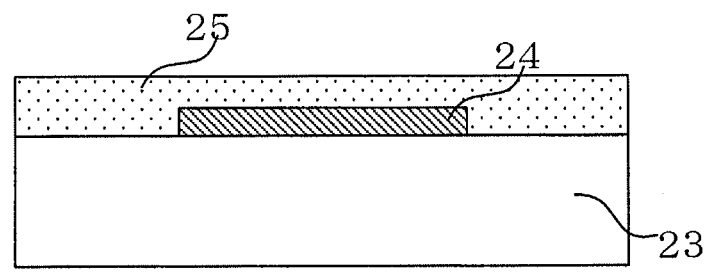
Figure 7C:
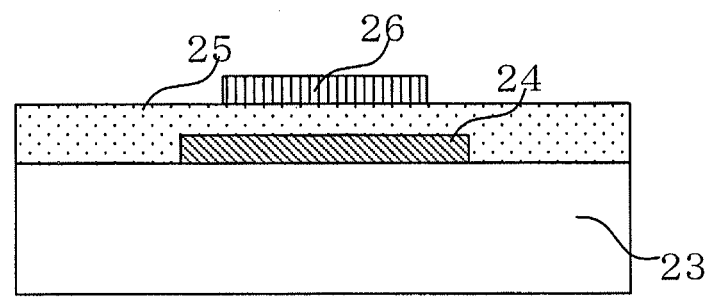

Thereafter, as shown in FIG. 7B, a silicon oxide film as a gate insulating film 25 was deposited in a thickness of 200 nm by a reactive sputtering method using a single crystal silicon target. Thereafter, as shown in FIG. 7C, an IGZO film to be an oxide semiconductor film 26 was deposited in a thickness of 50 nm by a sputtering method without exposing to the air, and the IGZO film was patterned into a shape of the oxide semiconductor film 26 by a photolithography method and a wet etching method. Note here that nitric acid, hydrochloric acid, oxalic acid, or mixed acid of those can be used for the wet etching. However, an oxalic acid solution of 5% concentration or less is used preferably.

Figure 8A:
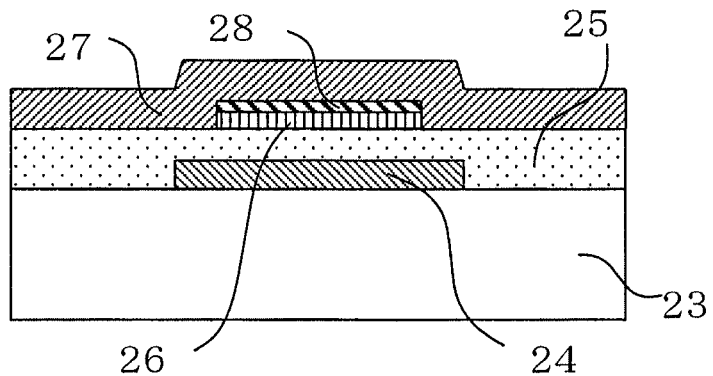
FIGS. 8A, 8B and 8C show second sectional views showing the oxide semiconductor TFT manufacturing method according to the fourth exemplary embodiment, and steps are executed in order of FIG. 8A, FIG. 8B, and FIG. 8C.
Figure 8B:
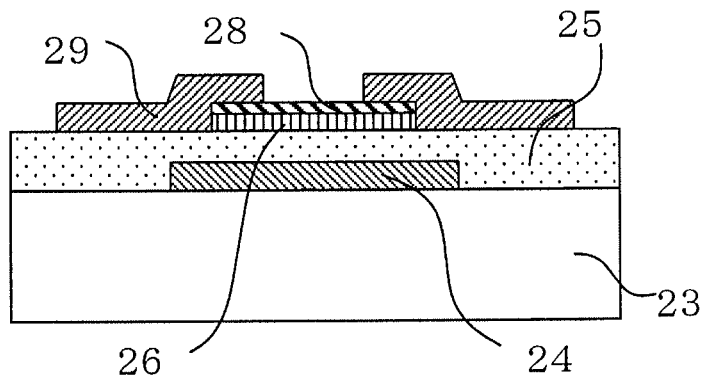

Thereafter, as shown in FIG. 8A, a Ti metal film 27 to be a source/drain electrode 29 was deposited in a thickness of 100 nm by a sputtering method. At this time, a layer 28 in which Ti is diffused to the IGZO layer is formed in an interface region between Ti to be the source/drain electrode 29 and IGZO as the oxide semiconductor film 26. It is confirmed by a depth profile analysis conducted by using an XPS method shown in FIG. 9 that the layer 28 is formed in a thickness of 50 nm at the maximum.

Due to a reducing process of Ti diffused to the IGZO layer, all of or a part of oxygen atoms of $In_2O_3$, $Ga_2O_3$, and ZnO constituting the IGZO layer leaves to form an oxygen deficit layer with a chemical composition of $In_2O_{3-x}$, $Ga_2O_{3-x}$, and $ZnO_{1-x}$.

Figure 10:
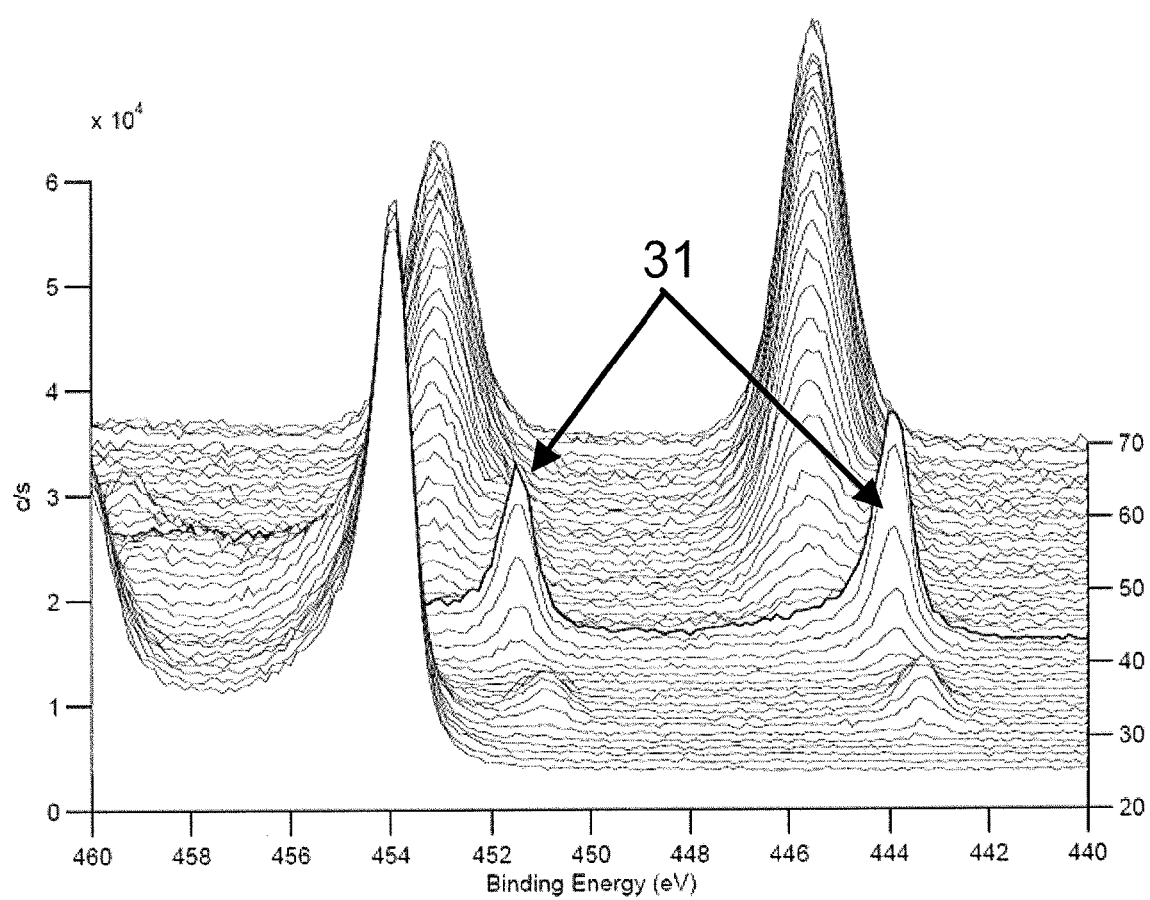
FIG. 10 is a graph showing an XPS spectrum (peak derived from In3d orbital) with respect to the film thickness direction of the source/drain region of the oxide semiconductor TFT according to the fourth exemplary embodiment.
Figure 11:
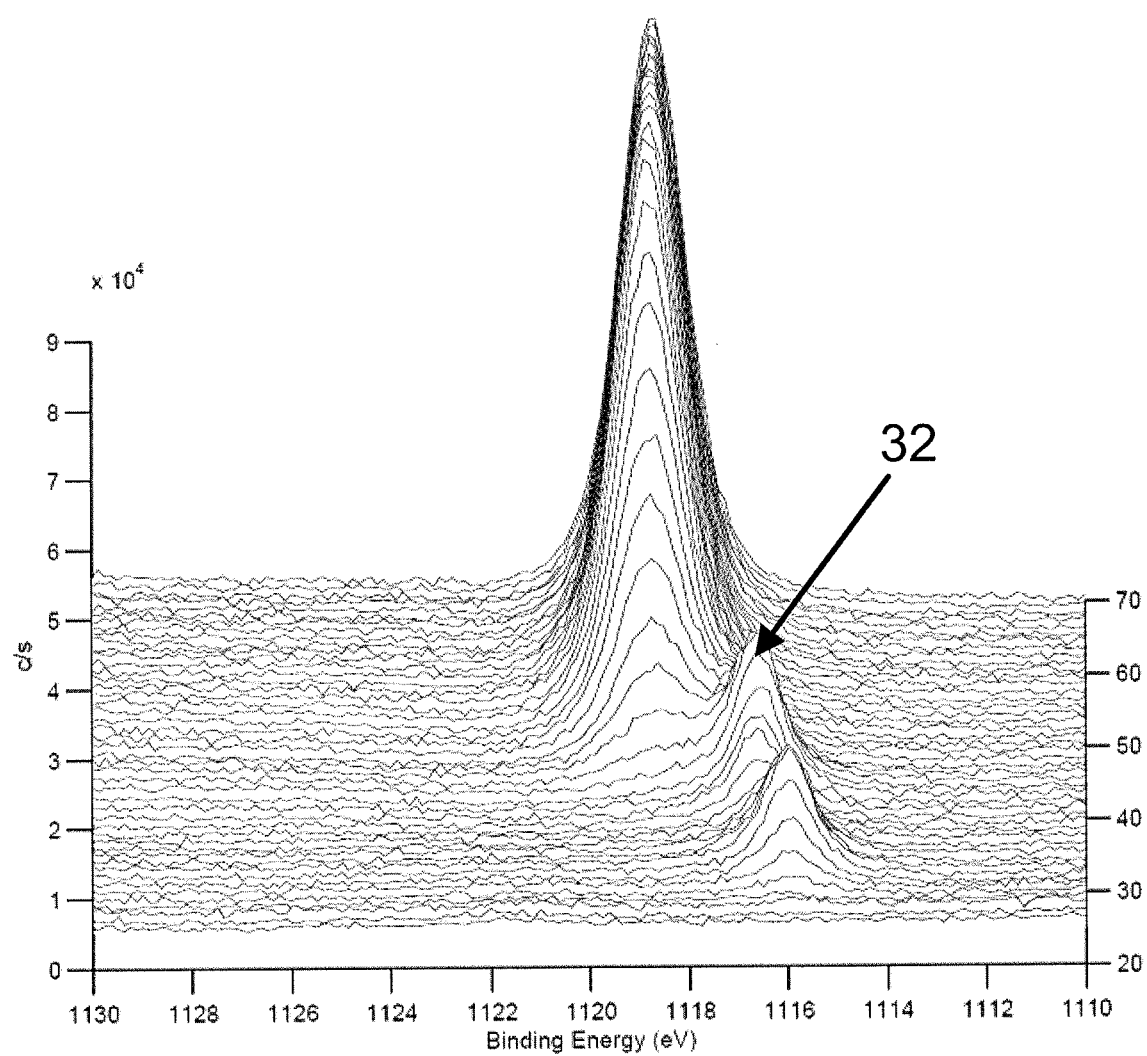
FIG. 11 is a graph showing an XPS spectrum (peak derived from Ga2p orbital) with respect to the film thickness direction of the source/drain region of the oxide semiconductor TFT according to the fourth exemplary embodiment.
Figure 12:
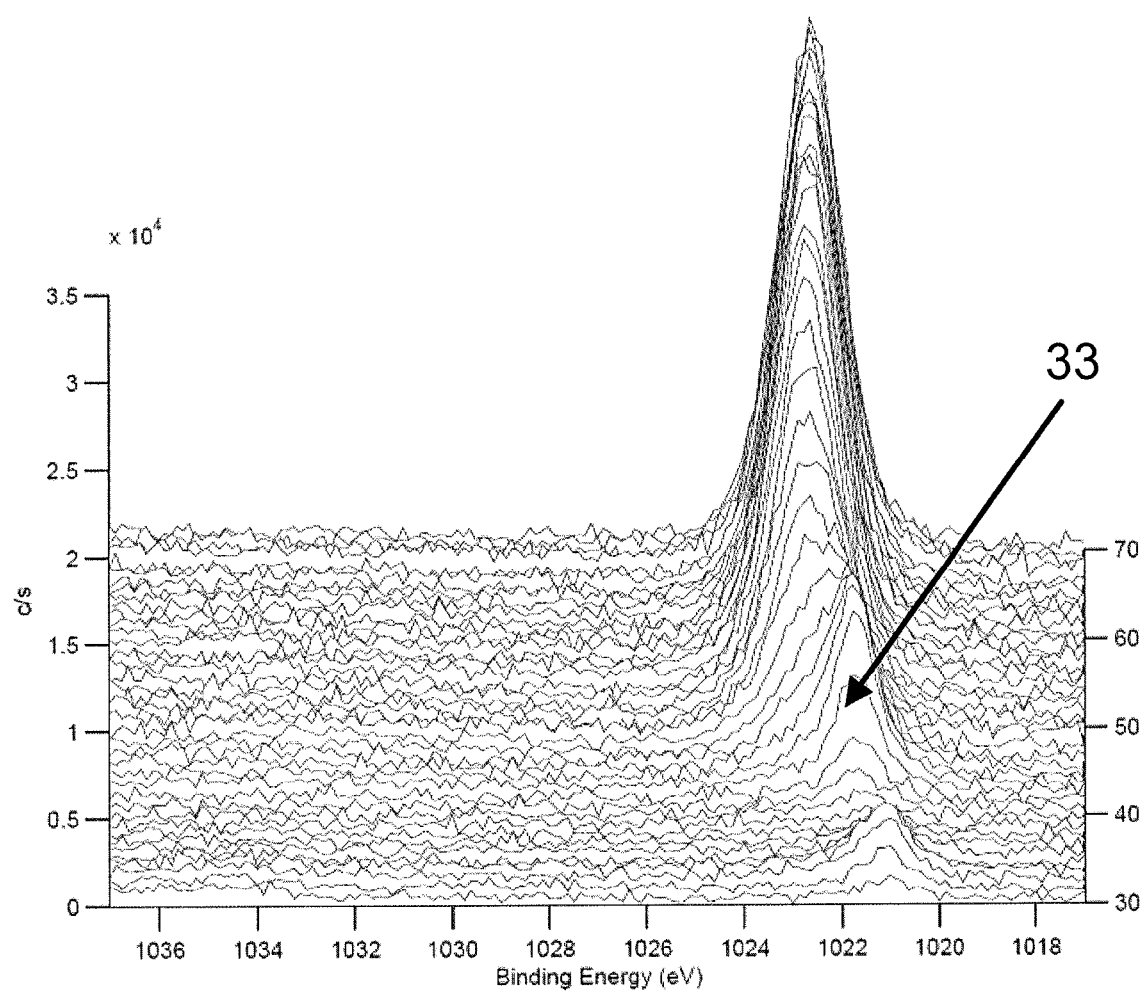
FIG. 12 is a graph showing an XPS spectrum (peak derived from Zn2p orbital) with respect to the film thickness direction of the source/drain region of the oxide semiconductor TFT according to the fourth exemplary embodiment.

As shown in FIG. 10 to FIG. 12, such oxygen deficit of the IGZO layer is observed as peaks 31, 32, and 33 which are peaks where a binding energy is shifted towards a low energy side with respect to $In_2O_3$ (FIG. 10), $Ga_2O_3$ (FIG. 11), and Zno (FIG. 12) as a stoichiometry composition by the depth profile analysis using the XPS method. The shift amount of the binding energy is about 0.1 to 5.0 eV. The deficit amount is insufficient with an extent of the oxygen deficit that is observed as a peak shift of less than 0.1 eV, so that the resistance of the oxygen deficit layer becomes high. In that case, it is not possible to acquire a fine electric characteristic as the TFT. A part of oxygen deficit formed on the IGZO layer is formed by being exposed to an Ar plasma environment when depositing the Ti metal film by sputtering. The oxygen deficit formed in the IGZO layer becomes a supply source of excessive donor electrons, so that an n+ layer set to be of low resistance is formed in the interface between Ti as the source/drain electrode 29 and IGZO as the oxide semiconductor film 26. Such n+ layer caused due to oxygen deficit contributes to forming a more thermally stable ohmic junction than that of a Schottky junction. An inductive coupling type plasma etching device (will be described later) is used for patterning Ti as the source/drain electrode 29 shown in FIG. 8B, and etching is performed by using $SF_6$ as a process gas without applying a substrate bias voltage.

Figure 8C:
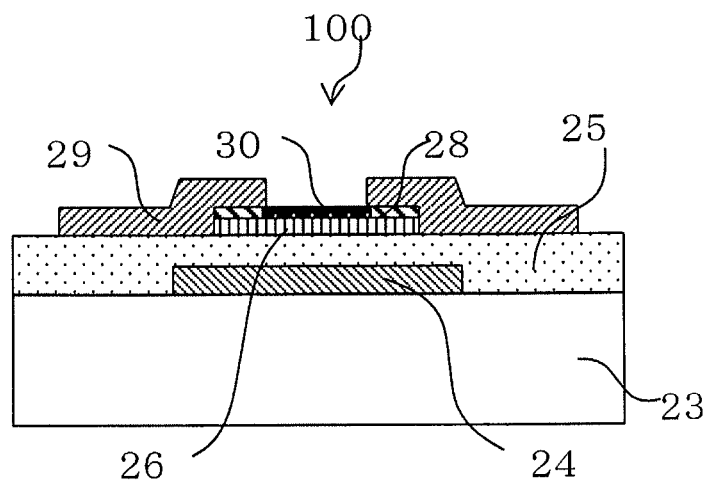
Figure 9:
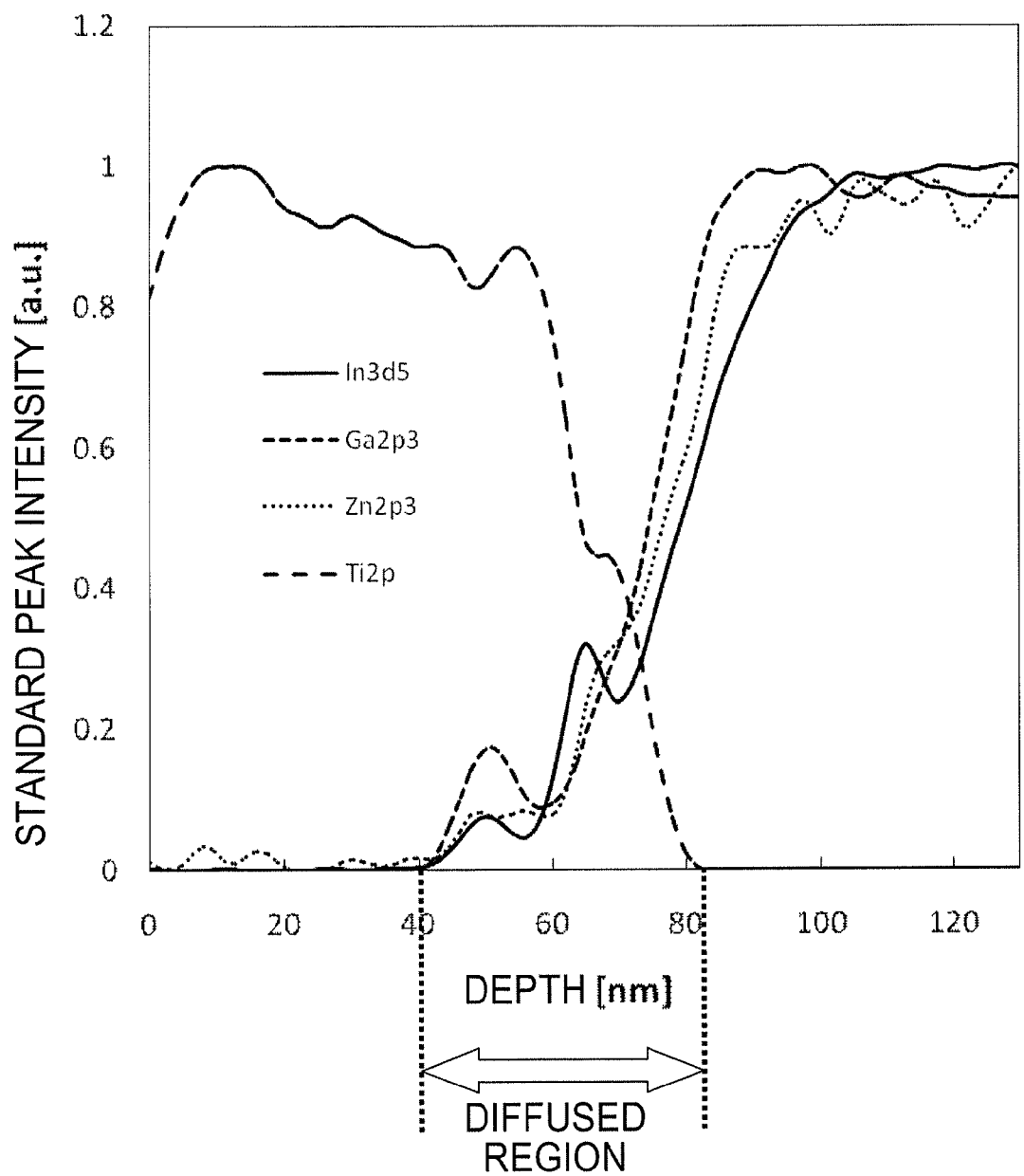
FIG. 9 is a graph showing the result of a depth profile analysis with respect to the film thickness direction of the source/drain region of the oxide semiconductor TFT according to the fourth exemplary embodiment (acquired by an XPS analysis method)

Subsequently, the top layer (back channel) of IGZO exposed by patterning the source/drain electrode 29 is exposed to $SF_6$ plasma. Through exposing the exposed IGZO to $SF_6$ plasma, it is possible to remove the Ti diffused layer formed on the outermost surface layer and to achieve re-termination of dangling bonds from which oxygen is detached by fluorine elements. Thus, as shown in FIG. 8C, it is possible to form a layer 30 that is acquired by setting the low-resistance n+ layer again to be of high resistance.

Figure 13:
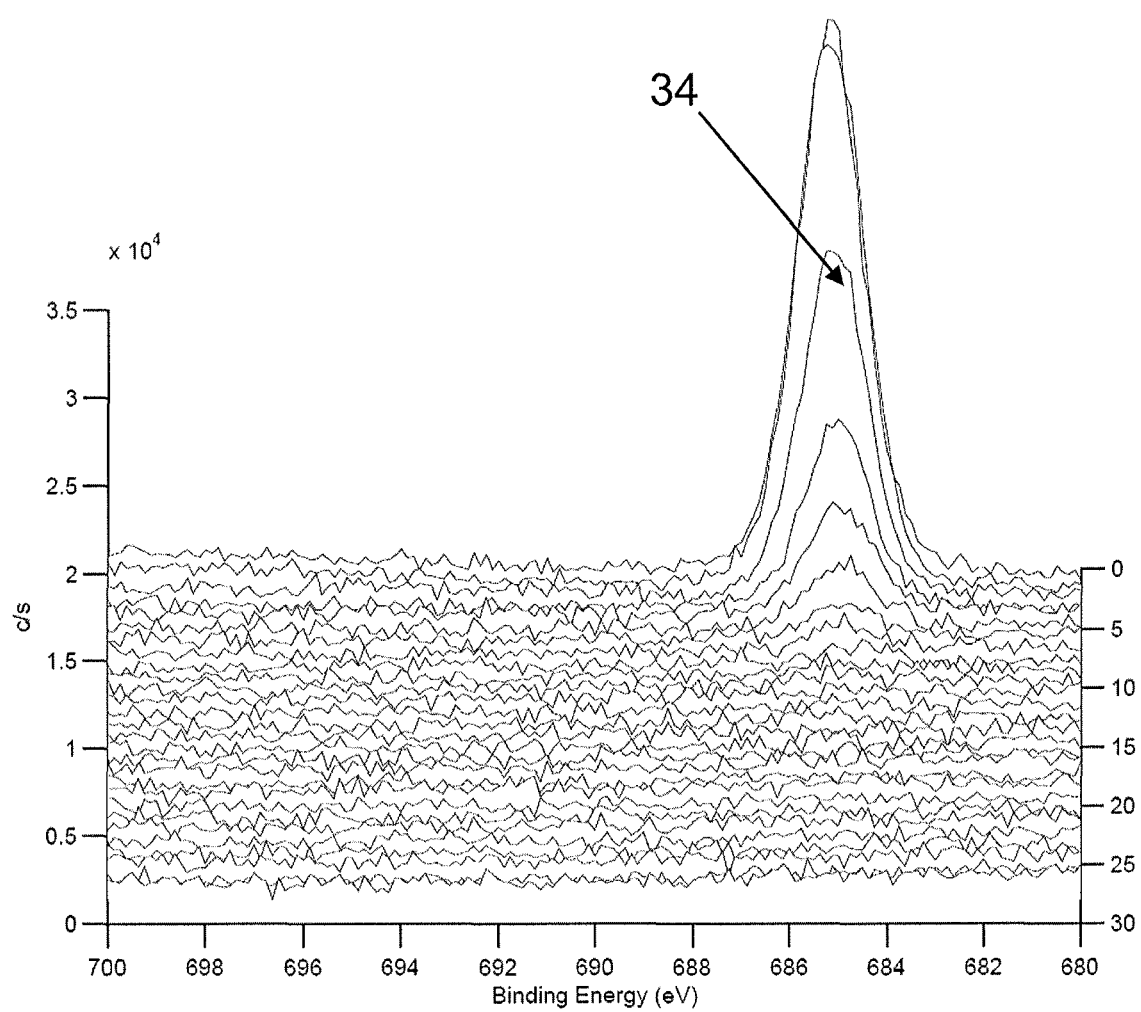
FIG. 13 is a graph showing an XPS spectrum (peak derived from FIs orbital) with respect to the film thickness direction of the oxide semiconductor film surface of the oxide semiconductor TFT according to the fourth exemplary embodiment.

Regarding such terminated layer by the fluorine elements, it is confirmed by a depth profile analysis using the XPS method shown in FIG. 13 that a peak 34 derived from the Fls orbital is observed to a depth of 5 nm at the maximum from the outermost surface layer.

Figure 14:
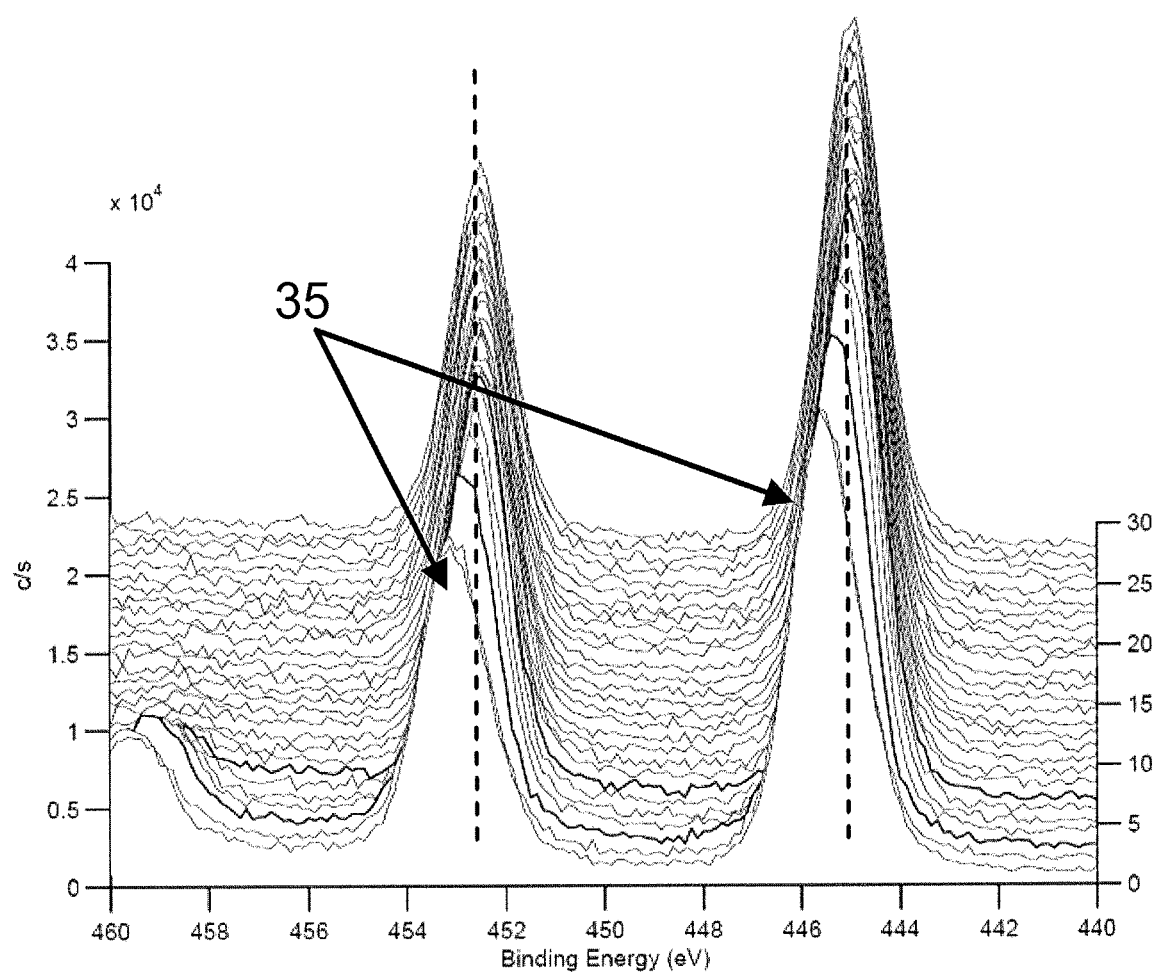
FIG. 14 is a graph showing an XPS spectrum (peak derived from In3d orbital) with respect to the film thickness direction of the oxide semiconductor film surface of the oxide semiconductor TFT according to the fourth exemplary embodiment.
Figure 15:
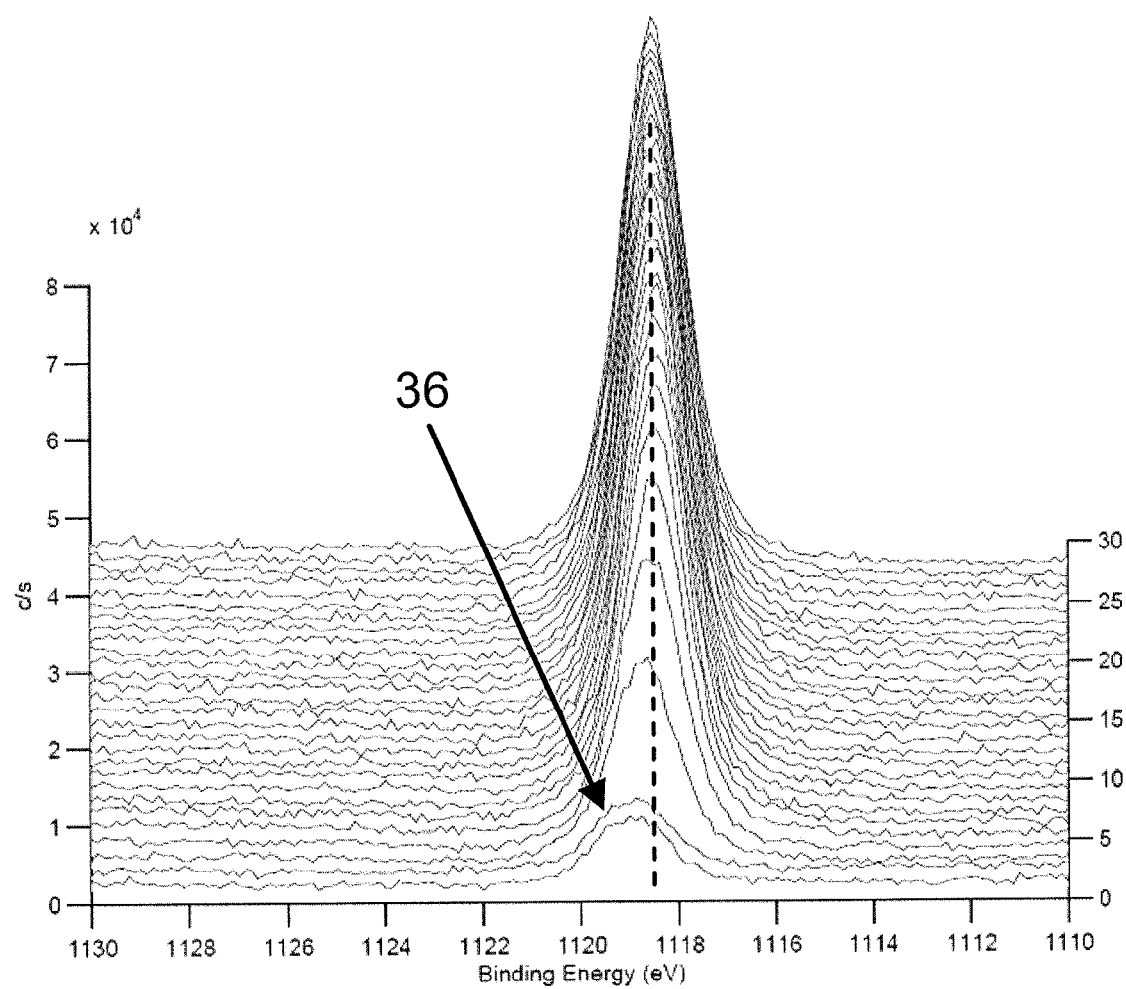
FIG. 15 is a graph showing an XPS spectrum (peak derived from Ga2p orbital) with respect to the film thickness direction of the oxide semiconductor film surface of the oxide semiconductor TFT according to the fourth exemplary embodiment.
Figure 16:
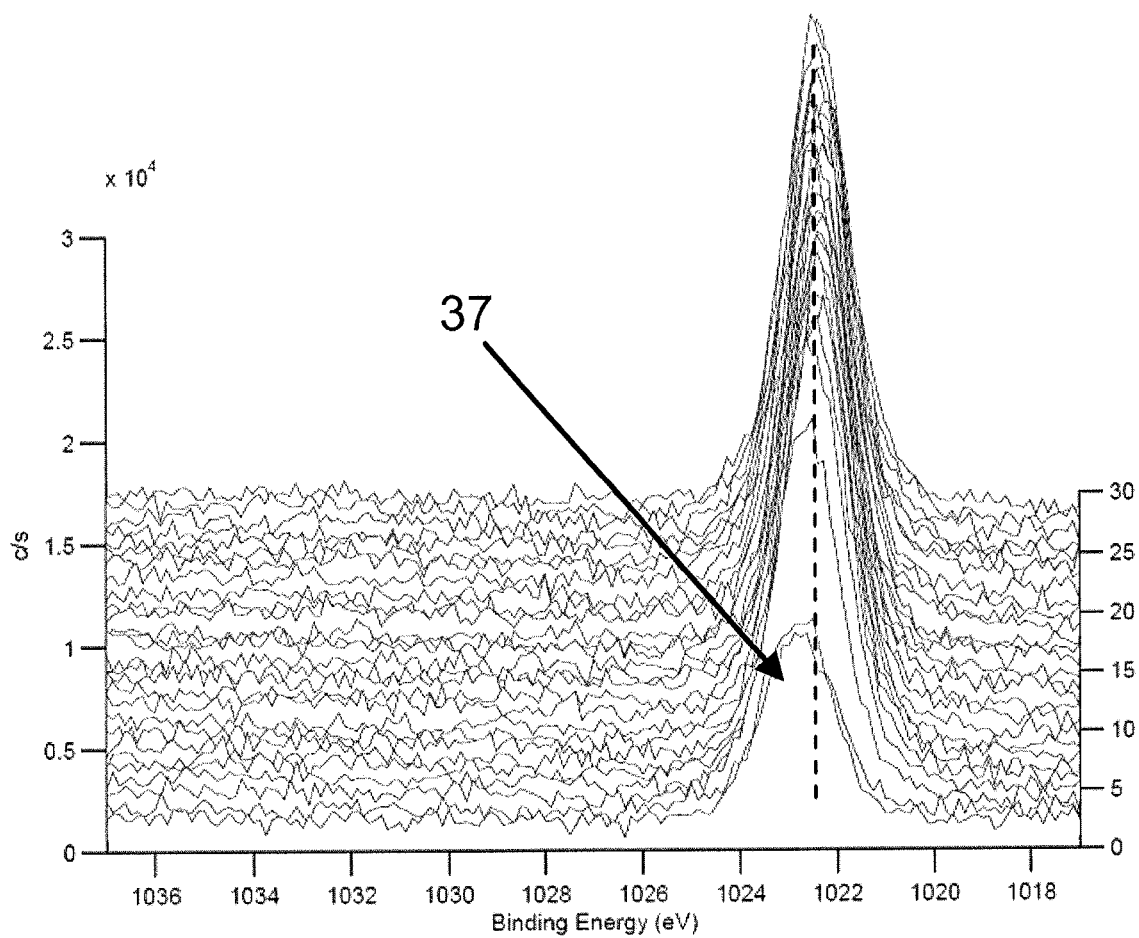
FIG. 16 is a graph showing an XPS spectrum (peak derived from Zn2p orbital) with respect to the film thickness direction of the oxide semiconductor film surface of the oxide semiconductor TFT according to the fourth exemplary embodiment.

As shown in FIG. 14 to FIG. 16, such layer terminated by fluorine is observed as peaks 35, 36, and 37 which are peaks where a binding energy is shifted towards a high energy side with respect to $In_2O_3$ (FIG. 14), $Ga_2O_3$ (FIG. 15), and Zno (FIG. 16) as a stoichiometry composition by the depth profile analysis using the XPS method.

Figure 17:
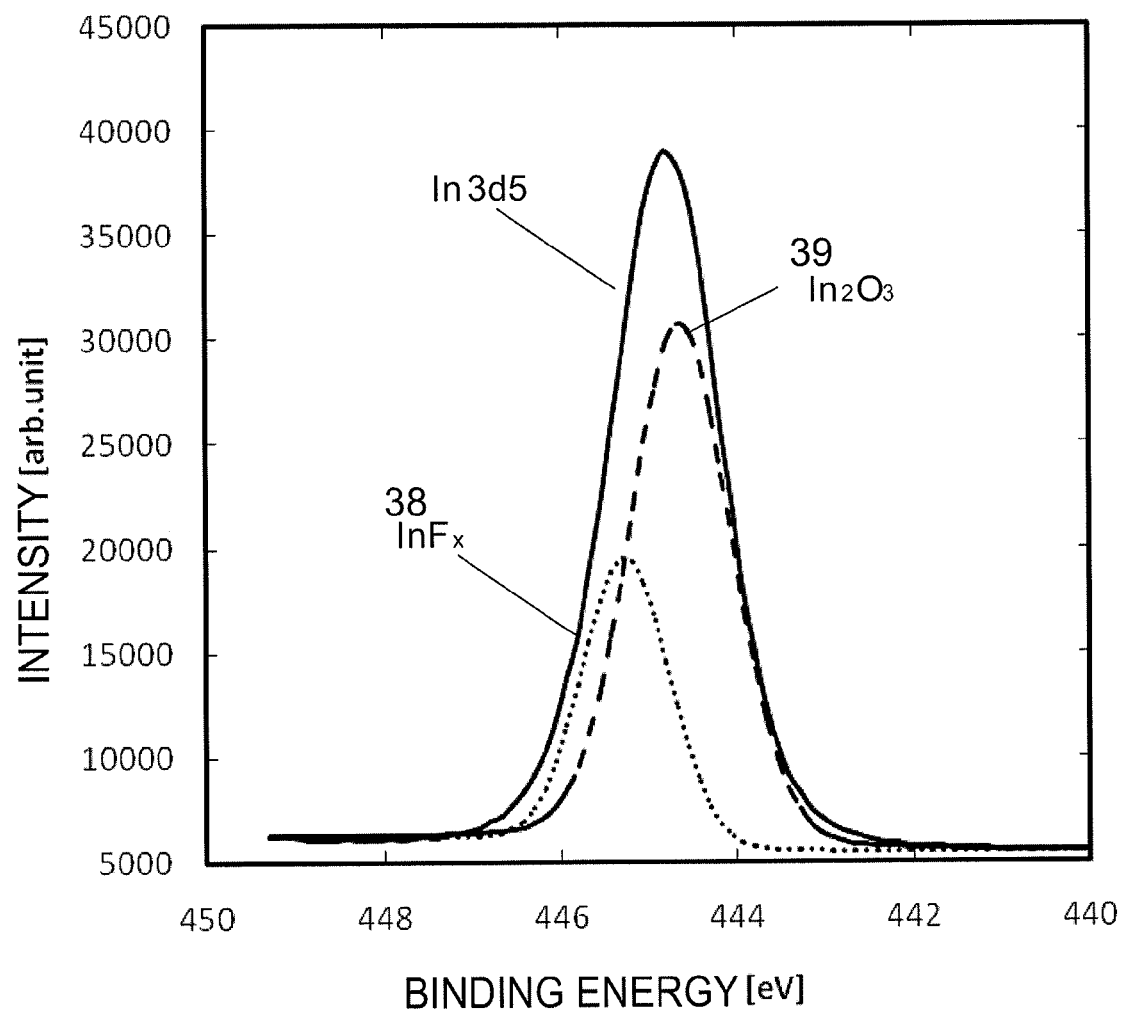
FIG. 17 is a graph showing the result specifically acquired by separating the peak derived from the In3d orbital from the XPS spectrum with respect to the film thickness direction of the oxide semiconductor film surface of the oxide semiconductor TFT according to the fourth exemplary embodiment.
Figure 18:
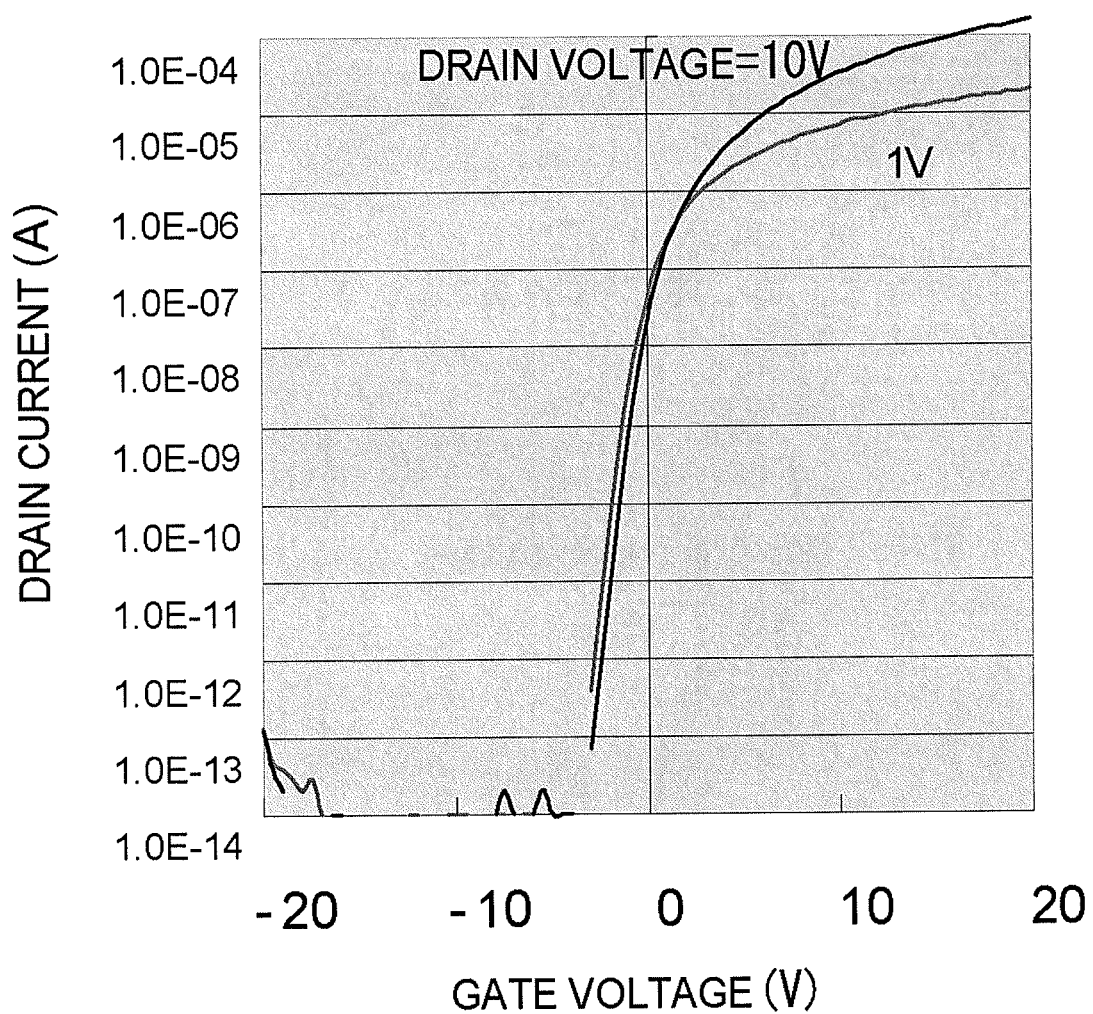
FIG. 18 is a graph showing the transmission characteristic of the oxide semiconductor TFT according to the fourth exemplary embodiment.
Figure 19:
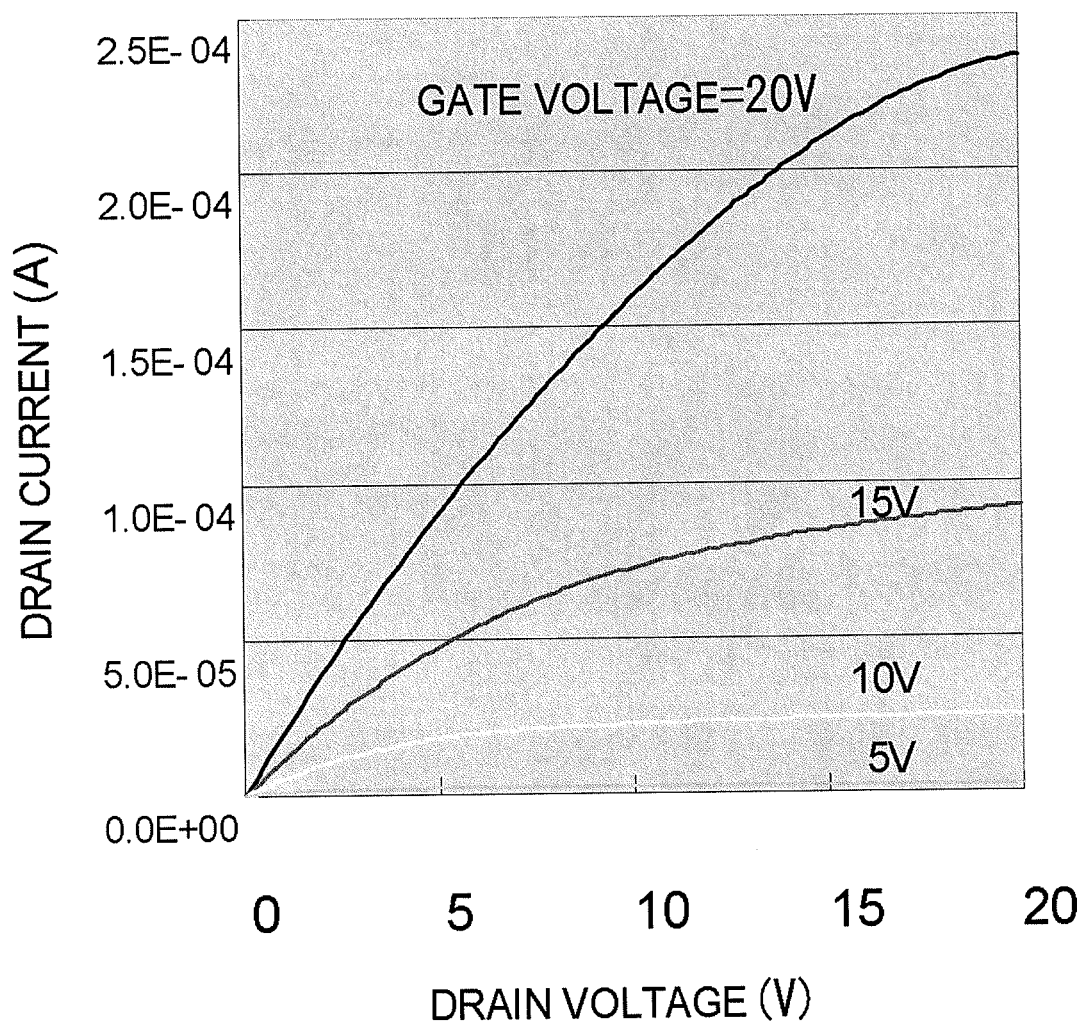
FIG. 19 is a graph showing the output characteristic of the oxide semiconductor TFT according to the fourth exemplary embodiment.

When trying to perform separation and reversion of the peaks of In, Ga, and Zn of the layer terminated by fluorine, it is possible to separate to the peak 38 derived from fluoridation and the peak 39 derived from oxidation. The result of In is shown in FIG. 17 as a representative example.

A TFT 100 shown in FIG. 8C was acquired through the above-described steps. As the actions of the TFT 100, fine transmission characteristic and output characteristic shown in FIG. 18 and FIG. 19 can be achieved.

(Fifth Exemplary Embodiment)

The TFT structure of a bottom gate structure according to a fifth exemplary embodiment and manufacturing steps thereof will be described by referring to FIG. 20A to FIG. 29.

Figure 20A:
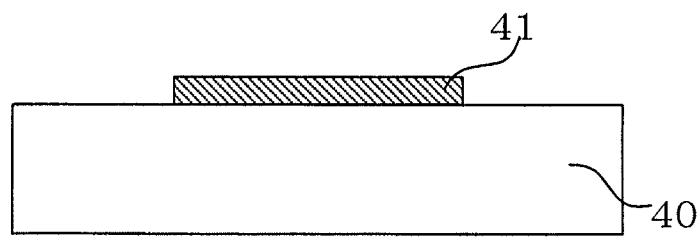
FIGS. 20A, 20B and 20C show first sectional views showing an oxide semiconductor TFT manufacturing method according to a fifth exemplary embodiment, and steps are executed in order of FIG. 20A, FIG. 20B, and FIG. 20C.

First, as shown in FIG. 20A, after depositing a Cr metal film to be a gate electrode 41 in a thickness of 50 nm on a glass substrate as an insulating substrate 40 by a sputtering method, the Cr metal film is patterned into a shape of the gate electrode 41 by using a photolithography method or a wet etching method.

Figure 20B:
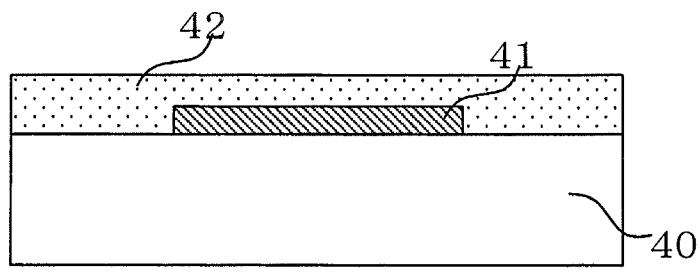
Figure 20C:
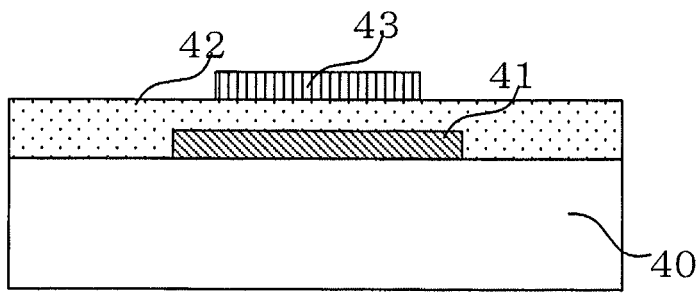

Thereafter, as shown in FIG. 20B, a silicon oxide film as a gate insulating film 42 is deposited in a thickness of 200 nm by a reactive sputtering method using a single crystal silicon target. Thereafter, as shown in FIG. 20C, IGZO to be an oxide semiconductor film 43 is deposited in a thickness of 50 nm by a sputtering method without exposing to the air, and the IGZO is patterned into a shape of the oxide semiconductor film 43 by a photolithography method and a wet etching method.

Figure 21A:
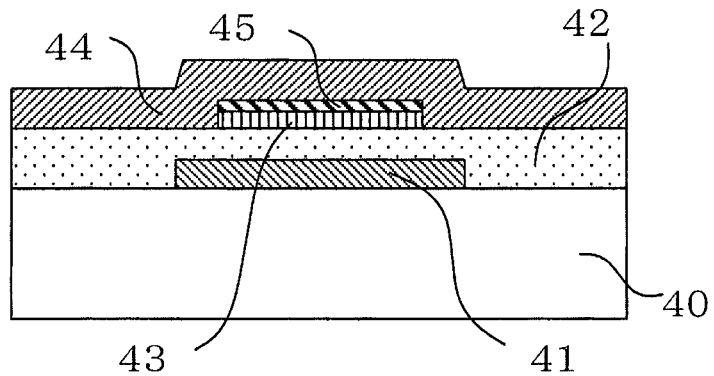
FIGS. 21A, 21B and 21C show second sectional views showing the oxide semiconductor TFT manufacturing method according to the fifth exemplary embodiment, and steps are executed in order of FIG. 21A, FIG. 21B, and FIG. 21C.

Thereafter, as shown in FIG. 21A, an Mo metal film 44 to be a source/drain electrode 46 is deposited in a thickness of 100 nm by a sputtering method.

Figure 22:
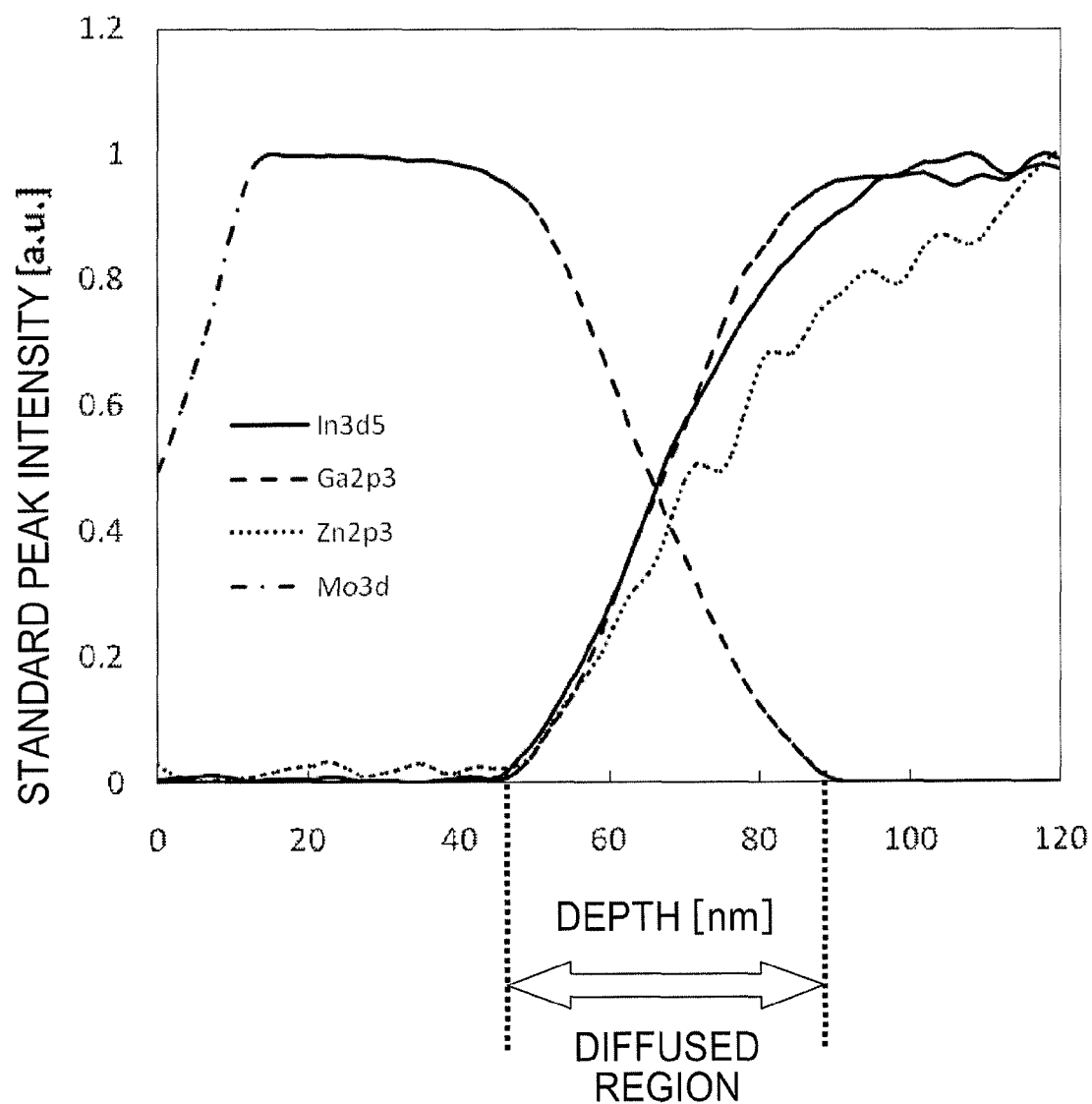
FIG. 22 is a graph showing the result of a depth profile analysis with respect to the film thickness direction of the source/drain region of the oxide semiconductor TFT according to the fifth exemplary embodiment (acquired by an XPS analysis method)

At this time, it is confirmed by a depth profile analysis conducted by using an XPS method shown in FIG. 22 that a layer 45 in which Mo is diffused to the IGZO layer is formed in an interface region between Mo to be the source/drain electrode 46 and IGZO as the oxide semiconductor film 43 in a thickness of 50 nm at the maximum.

Because it is exposed to an Ar plasma environment when depositing the Mo metal film 44 by sputtering, all of or a part of oxygen atoms of $In_2O_3$ constituting the IGZO layer leave to form an oxygen deficit layer with a chemical composition of $In_2O_{3-x}$. Since Mo is an inert metal, the effect of Mo itself does not contribute to forming an oxygen deficit layer. With a structure in which Mo is used for the source/drain electrode 46, shift of the peak towards the low energy side caused due to oxygen deficit is not observed in Ga and Zn.

Figure 23:
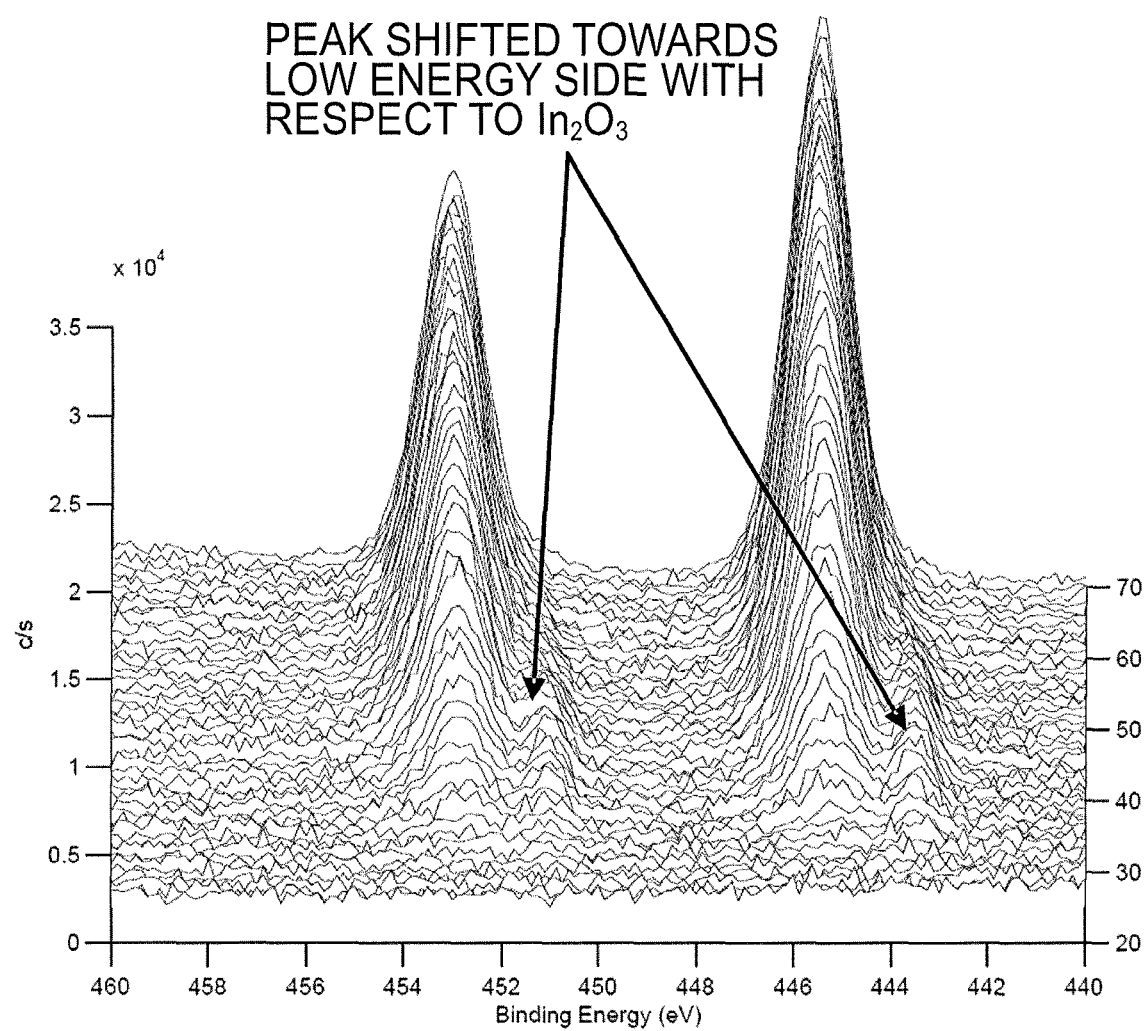
FIG. 23 is a graph showing an XPS spectrum (peak derived from In3d orbital) with respect to the film thickness direction of the source/drain region of the oxide semiconductor TFT according to the fifth exemplary embodiment.

As shown in FIG. 23, such oxygen deficit of the IGZO layer is observed as peaks which are peaks where a binding energy is shifted towards a low energy side with respect to $In_2O_3$ as a stoichiometry composition by the depth profile analysis using the XPS method. The shift amount of the binding energy is about 0.1 to 5.0 eV. The deficit amount is insufficient with an extent of the oxygen deficit that is observed as a peak shift of less than 0.1 eV, so that the resistance of the oxygen deficit layer becomes high. In that case, it is not possible to acquire a fine electric characteristic.

The oxygen deficit formed in the IGZO layer becomes a supply source of excessive donor electrons, so that an n+ layer set to be of low resistance is formed in the interface between Mo as the source/drain electrode 46 and IGZO as the oxide semiconductor film 43. Such n+ layer caused due to oxygen deficit contributes to forming a more thermally stable ohmic junction than that of a Schottky junction.

Figure 21B:
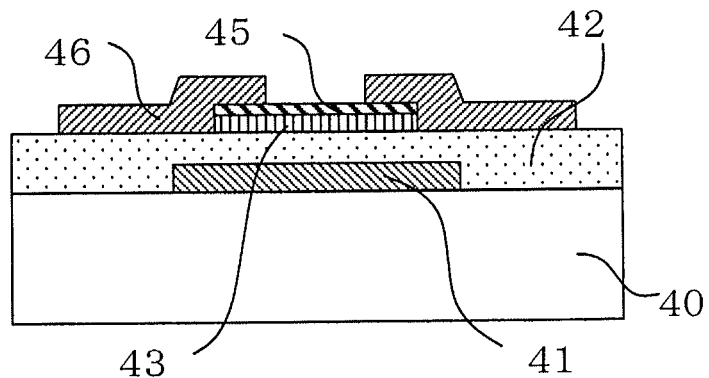

An inductive coupling type plasma etching device (will be described later) is used for patterning Mo as the source/drain electrode 46 shown in FIG. 21B, and etching is performed by using $SF_6$ as a process gas without applying a substrate bias voltage.

Subsequently, the top layer (back channel) of IGZO exposed by patterning the source/drain electrode 46 is exposed to $SF_6$ plasma. Through exposing the exposed IGZO to $SF_6$ plasma, it is possible to remove the Mo diffused layer formed on the outermost surface layer and to achieve re-termination of dangling bonds from which oxygen is detached by fluorine elements. Thus, as shown in FIG. 21C, it is possible to form a layer 47 that is acquired by setting the low-resistance n+ layer again to be of high resistance.

Figure 24:
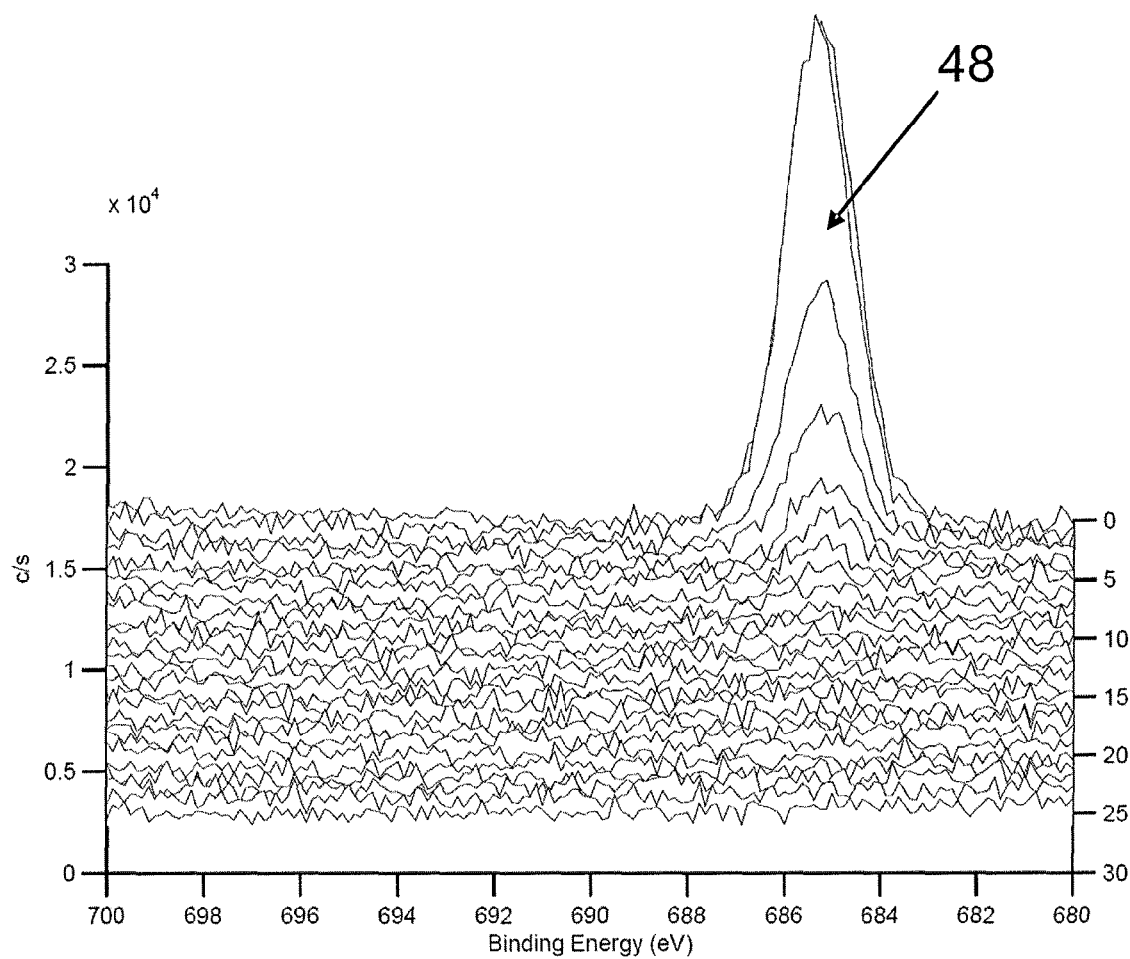
FIG. 24 is a graph showing an XPS spectrum (peak derived from FIs orbital) with respect to the film thickness direction of the oxide semiconductor film surface of the oxide semiconductor TFT according to the fifth exemplary embodiment.

Regarding such terminated layer by the fluorine elements, it is confirmed by a depth profile analysis using an XPS method shown in FIG. 24 that a peak 48 caused due to the Fls orbital is observed to a depth of 5 nm at the maximum from the outermost surface layer.

Figure 25:
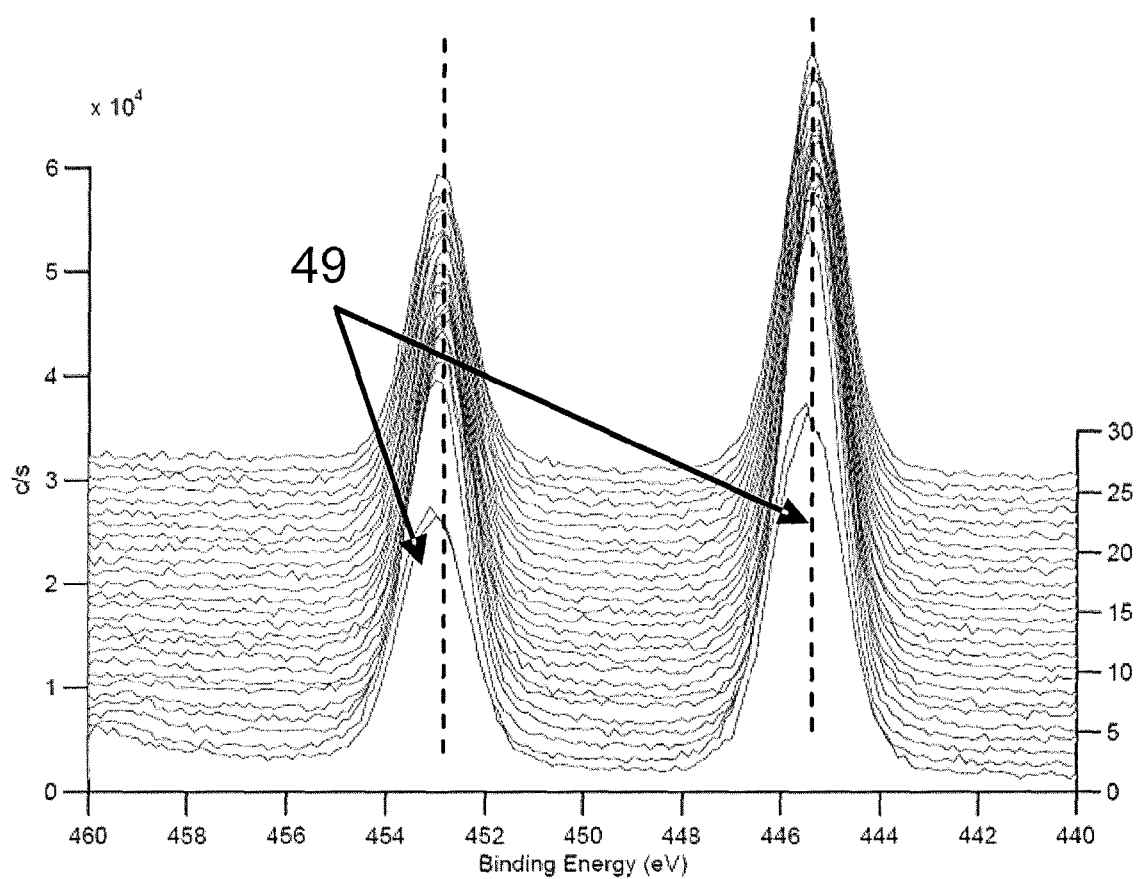
FIG. 25 is a graph showing an XPS spectrum (peak derived from In3d orbital) with respect to the film thickness direction of the oxide semiconductor film surface of the oxide semiconductor TFT according to the fifth exemplary embodiment.
Figure 26:
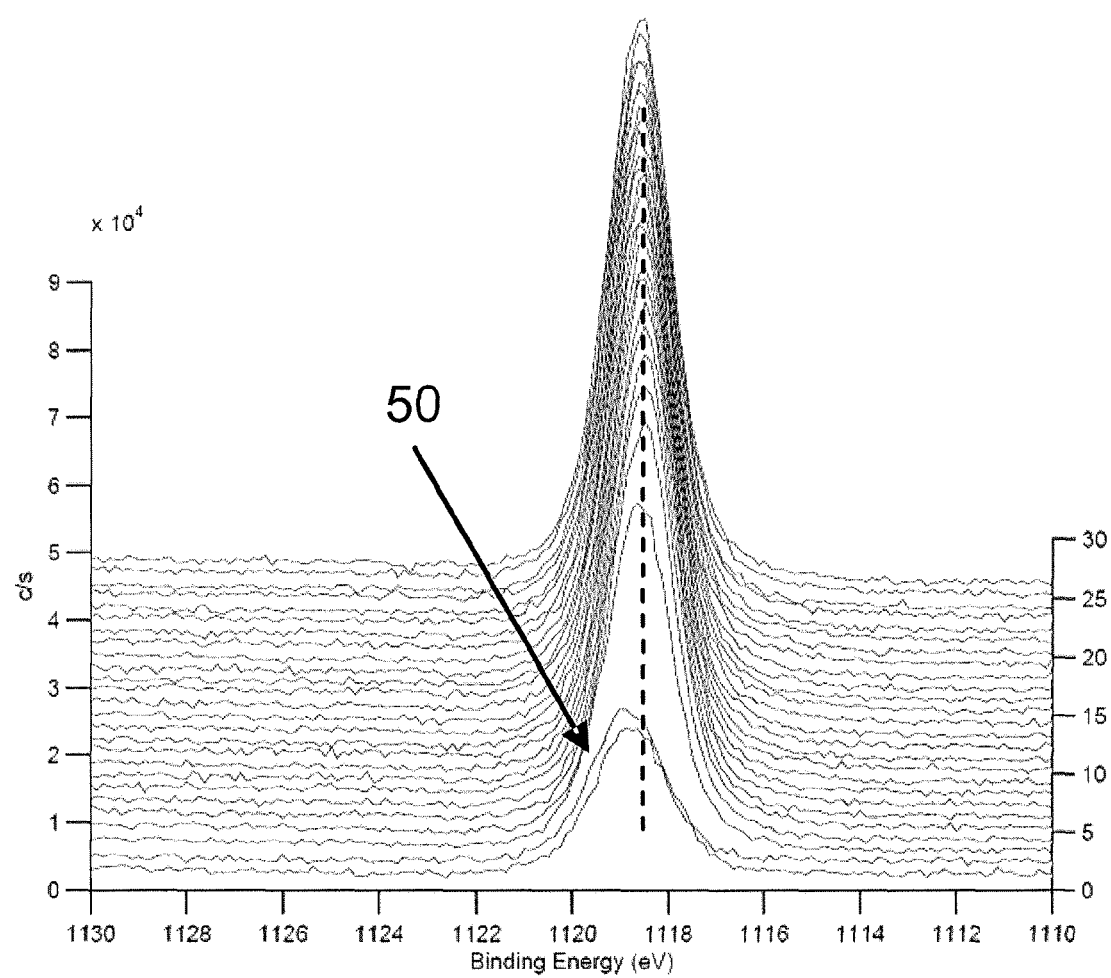
FIG. 26 is a graph showing an XPS spectrum (peak derived from Ga2p orbital) with respect to the film thickness direction of the oxide semiconductor film surface of the oxide semiconductor TFT according to the fifth exemplary embodiment.
Figure 27:
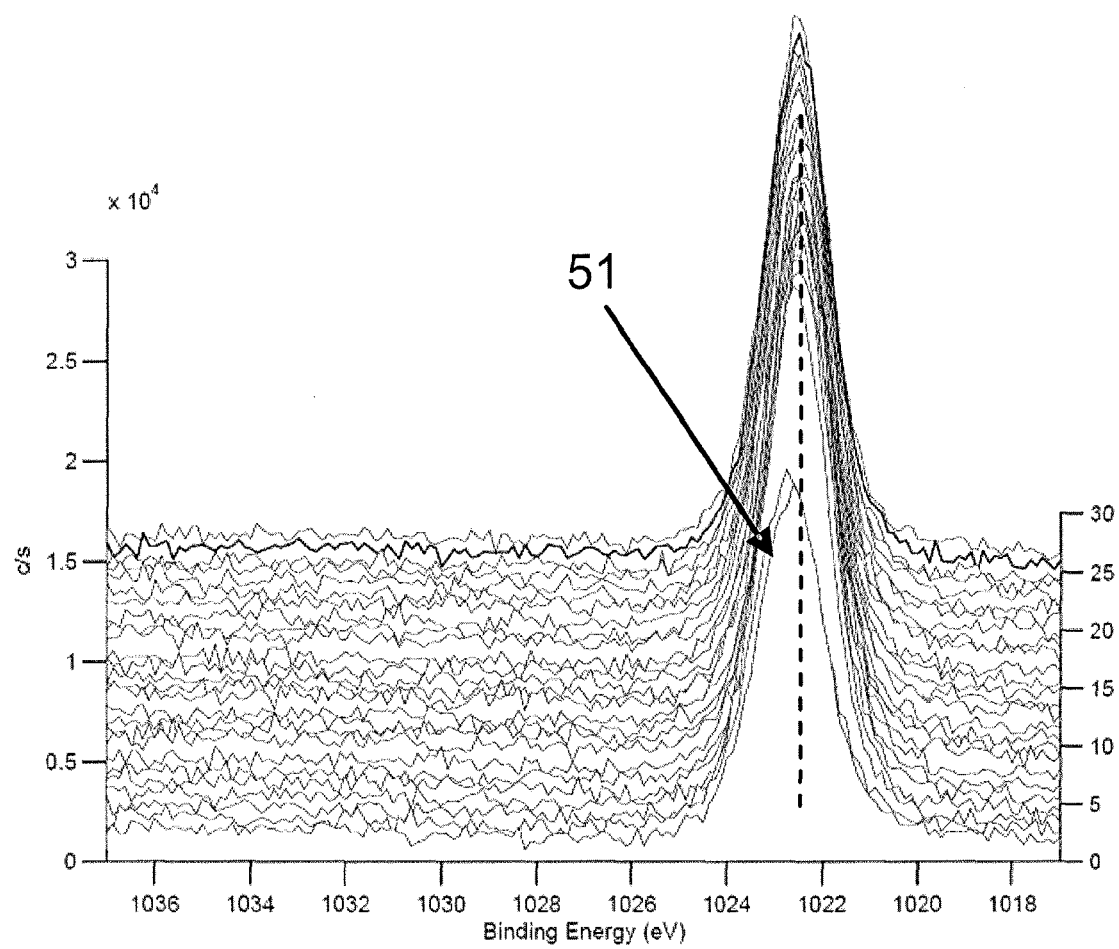
FIG. 27 is a graph showing an XPS spectrum (peak derived from Zn2p orbital) with respect to the film thickness direction of the oxide semiconductor film surface of the oxide semiconductor TFT according to the fifth exemplary embodiment.
Figure 28:
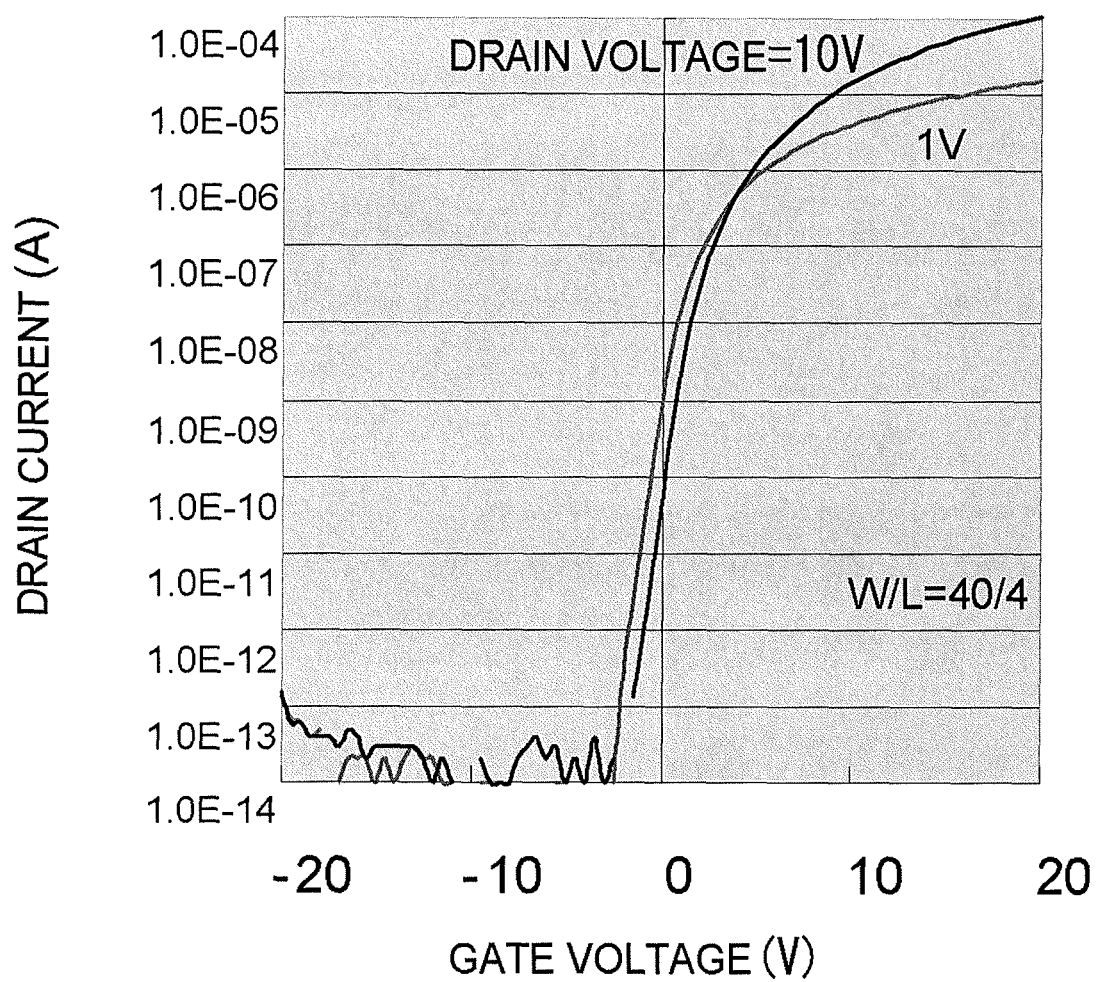
FIG. 28 is a graph showing the transmission characteristic of the oxide semiconductor TFT according to the fifth exemplary embodiment.
Figure 29:
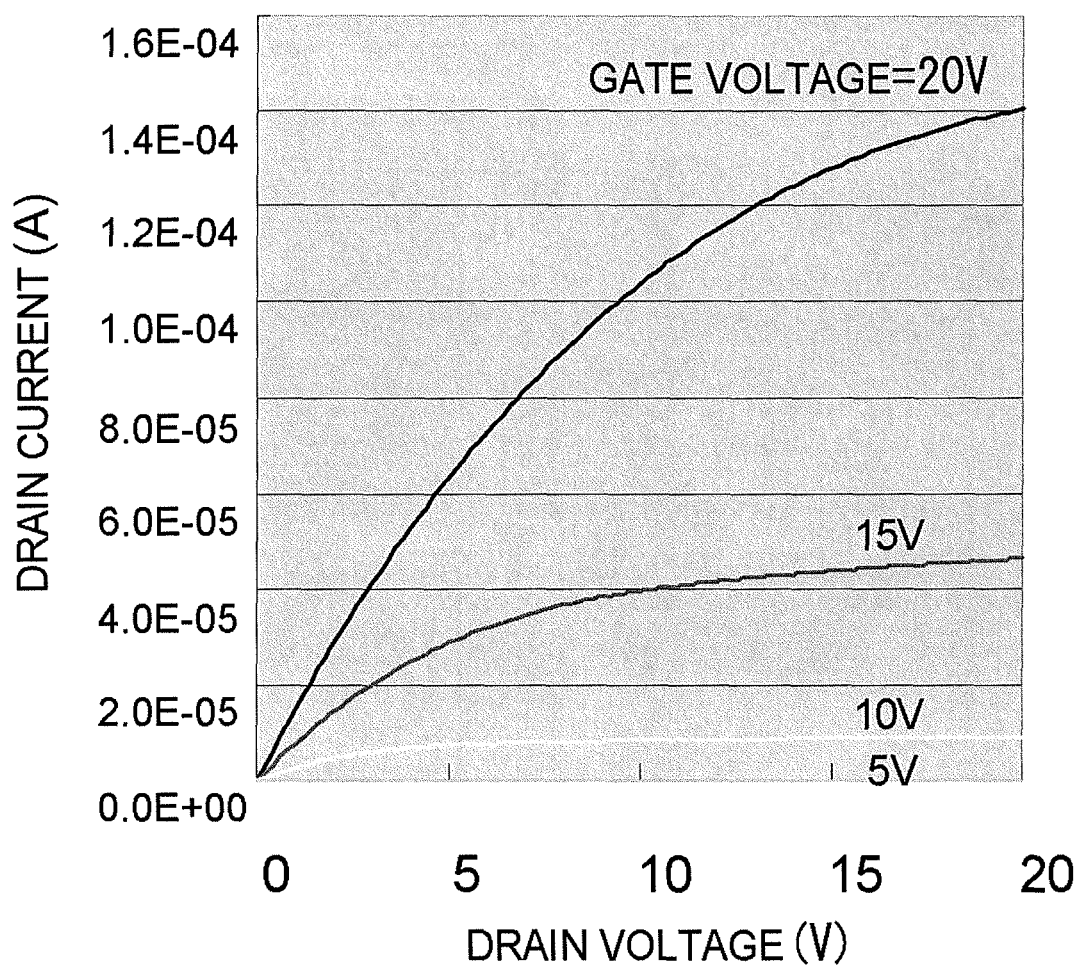
FIG. 29 is a graph showing the output characteristic of the oxide semiconductor TFT according to the fifth exemplary embodiment.

As shown in FIG. 25 to FIG. 27, such layer terminated by fluorine is observed as peaks 49, 50, and 51 which are peaks where a binding energy is shifted towards a high energy side with respect to $In_2O_3$ (FIG. 25), $Ga_2O_3$ (FIG. 26), and Zno (FIG. 27) as a stoichiometry composition by the depth profile analysis using the XPS method.

Figure 21C:
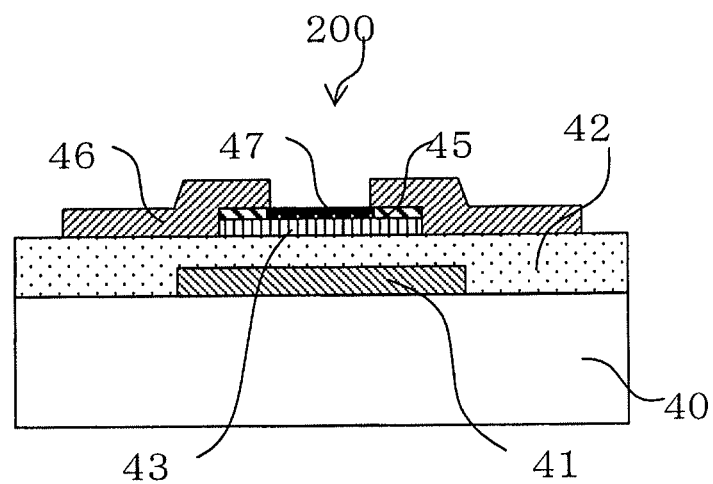

A TFT 200 shown in FIG. 21C was acquired through the above-described steps. As the actions of the TFT 200, fine transmission characteristic and output characteristic shown in FIG. 28 and FIG. 29 can be achieved.

(Sixth Exemplary Embodiment)

The TFT structure of a bottom gate structure according to a sixth exemplary embodiment and manufacturing steps thereof will be described by referring to FIG. 30 and FIG. 31.

Figure 30:
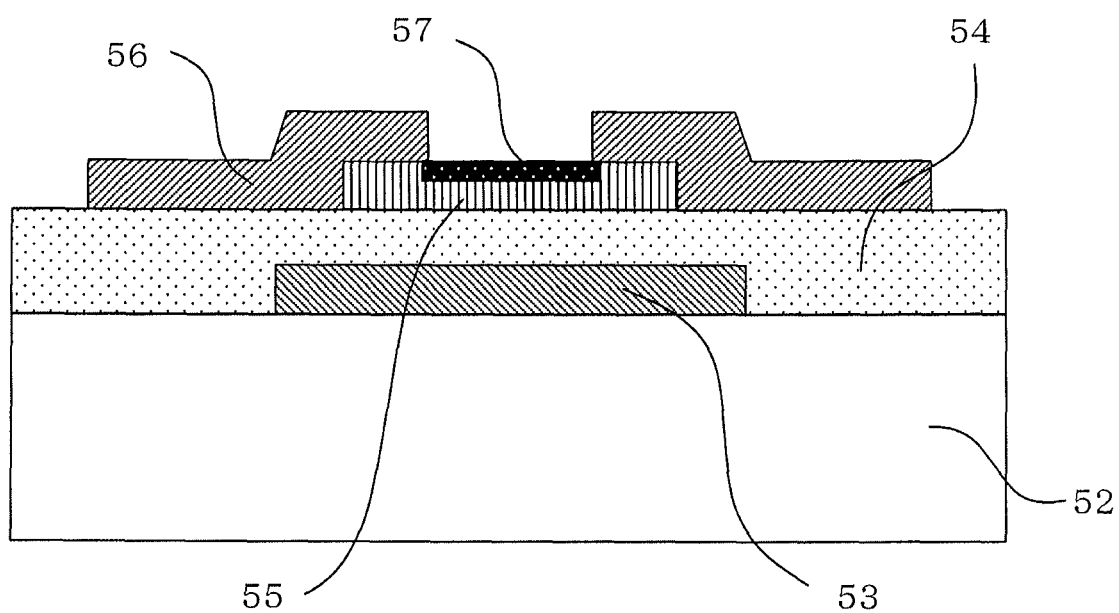
FIG. 30 is a sectional view showing the structure of an oxide semiconductor TFT according to a sixth exemplary embodiment.
Figure 31:
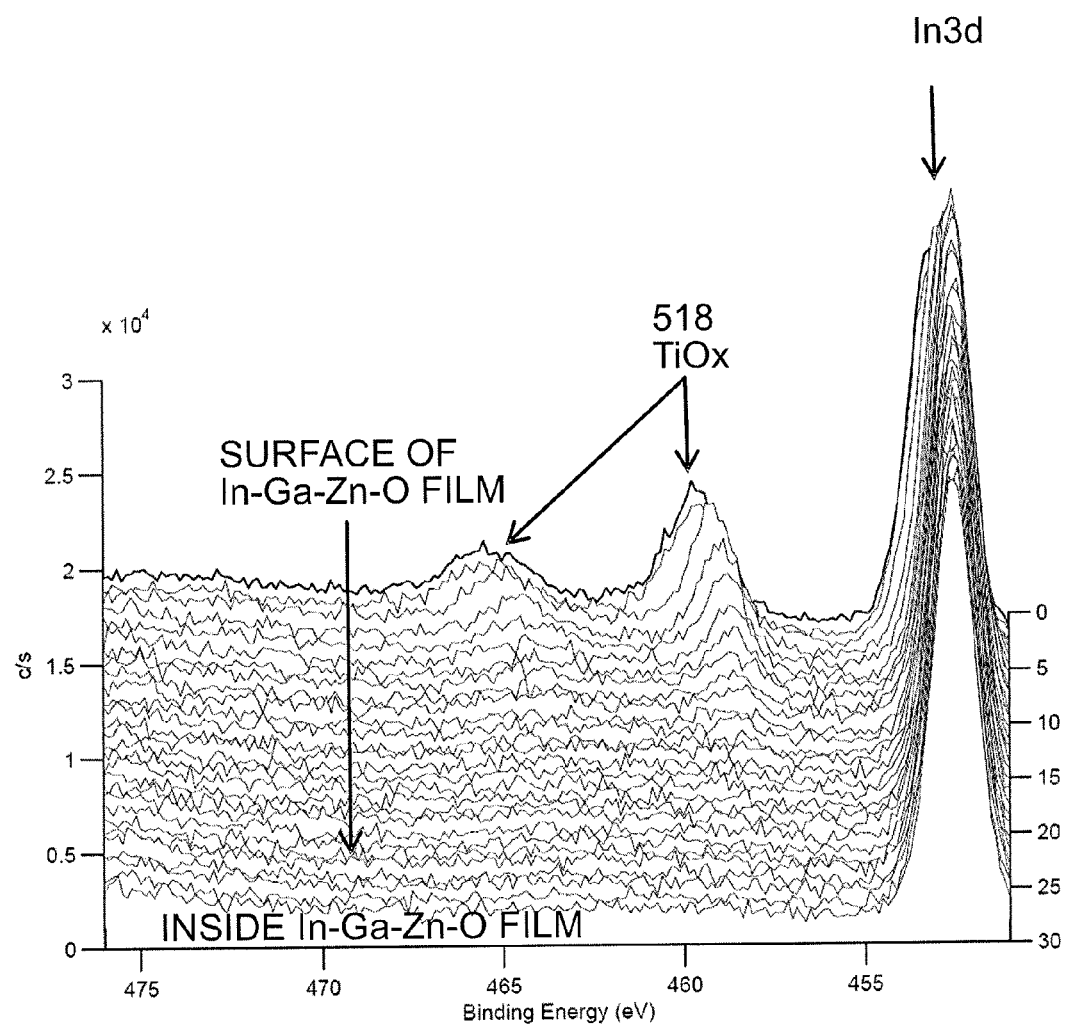
FIG. 31 is a graph showing an XPS spectrum with respect to the film thickness direction of the oxide semiconductor film surface of the oxide semiconductor TFT according to the sixth exemplary embodiment.

First, as shown in FIG. 30, after depositing a Cr metal film to be a gate electrode 53 in a thickness of 50 nm on a glass substrate as an insulating substrate 52 by a sputtering method, the Cr metal film is patterned into a shape of the gate electrode 53 by using a photolithography method or a wet etching method.

Thereafter, a silicon oxide film as a gate insulating film 54 is deposited in a thickness of 200 nm by a reactive sputtering method using a single crystal silicon target.

Thereafter, an IGZO film to be an oxide semiconductor film 55 is deposited in a thickness of 50 nm by a sputtering method without exposing to the air, and the IGZO film is patterned into a shape of the oxide semiconductor film 55 by a photolithography method and a wet etching method. Note here that nitric acid, hydrochloric acid, oxalic acid, or mixed acid of those can be used for the wet etching. However, an oxalic acid solution of 5% concentration or less is used preferably.

Thereafter, a Ti metal film to be a source/drain electrode 56 is deposited in a thickness of 100 nm by a sputtering method, and the Ti metal film is patterned into a shape of the source/drain electrode 56 by using an inductive coupling type plasma etching device.

At this time, TiOx 57 existing on the interface layer between the Ti metal film and IGZO remains on the outermost surface due to an etching rate difference between TiOx and titanium. Such TiOx remaining layer is confirmed to exist since a peak 58 derived from Ti2p orbital is observed to a depth of 5 nm from the outermost surface layer at the maximum by a depth profile analysis done by the XPS analysis method shown in FIG. 31. By providing such surface layer constituted with TiOx, it is possible to achieve a TFT exhibiting a more stable characteristic for the external environment.

(Seventh Exemplary Embodiment)

Figure 32:
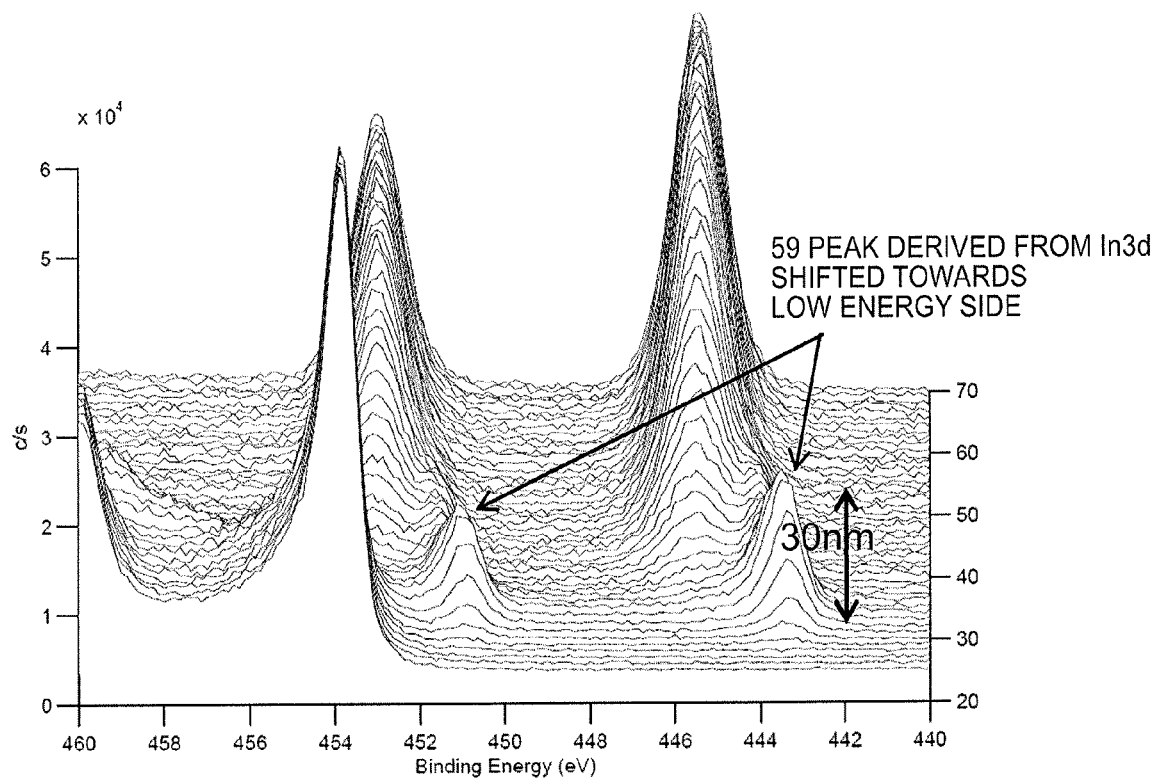
FIG. 32 is a graph showing an XPS spectrum with respect to the film thickness direction of the source/drain electrode of the oxide semiconductor TFT according to a seventh exemplary embodiment (before executing 300° C. annealing)
Figure 33:
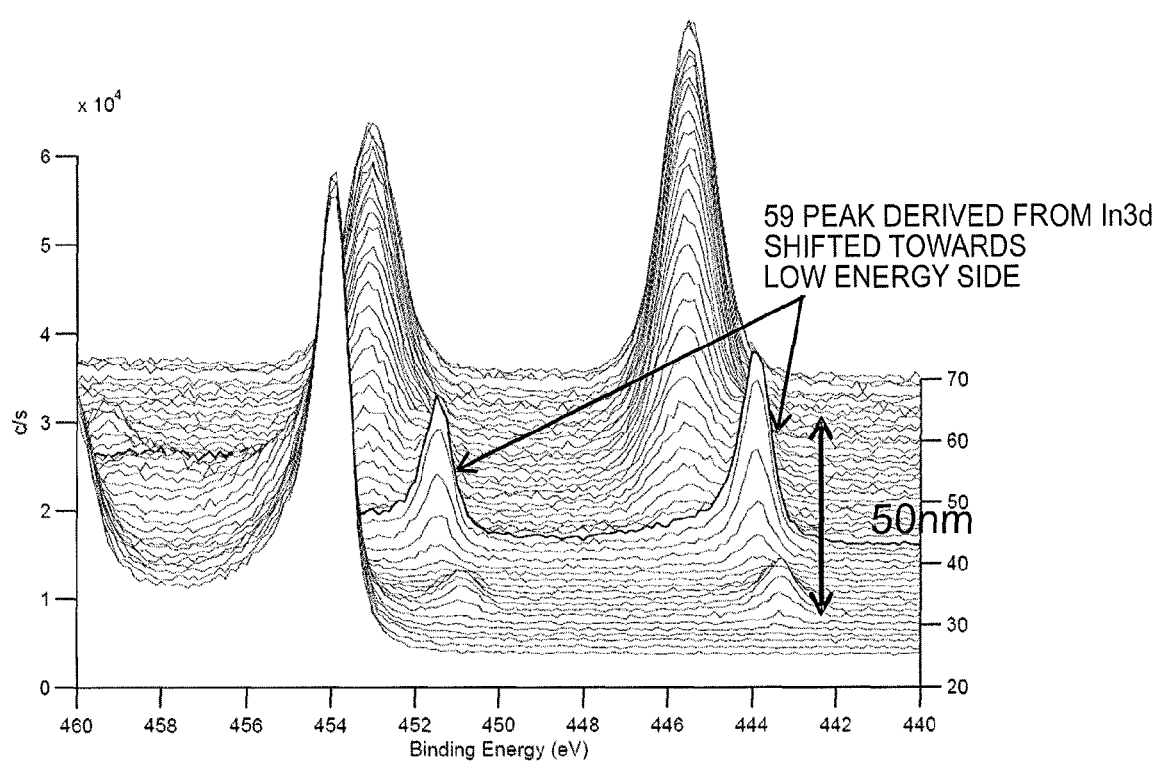
FIG. 33 is a graph showing an XPS spectrum with respect to the film thickness direction of the source/drain electrode of the oxide semiconductor TFT according to the seventh exemplary embodiment (after executing 300° C. annealing)
Figure 34:
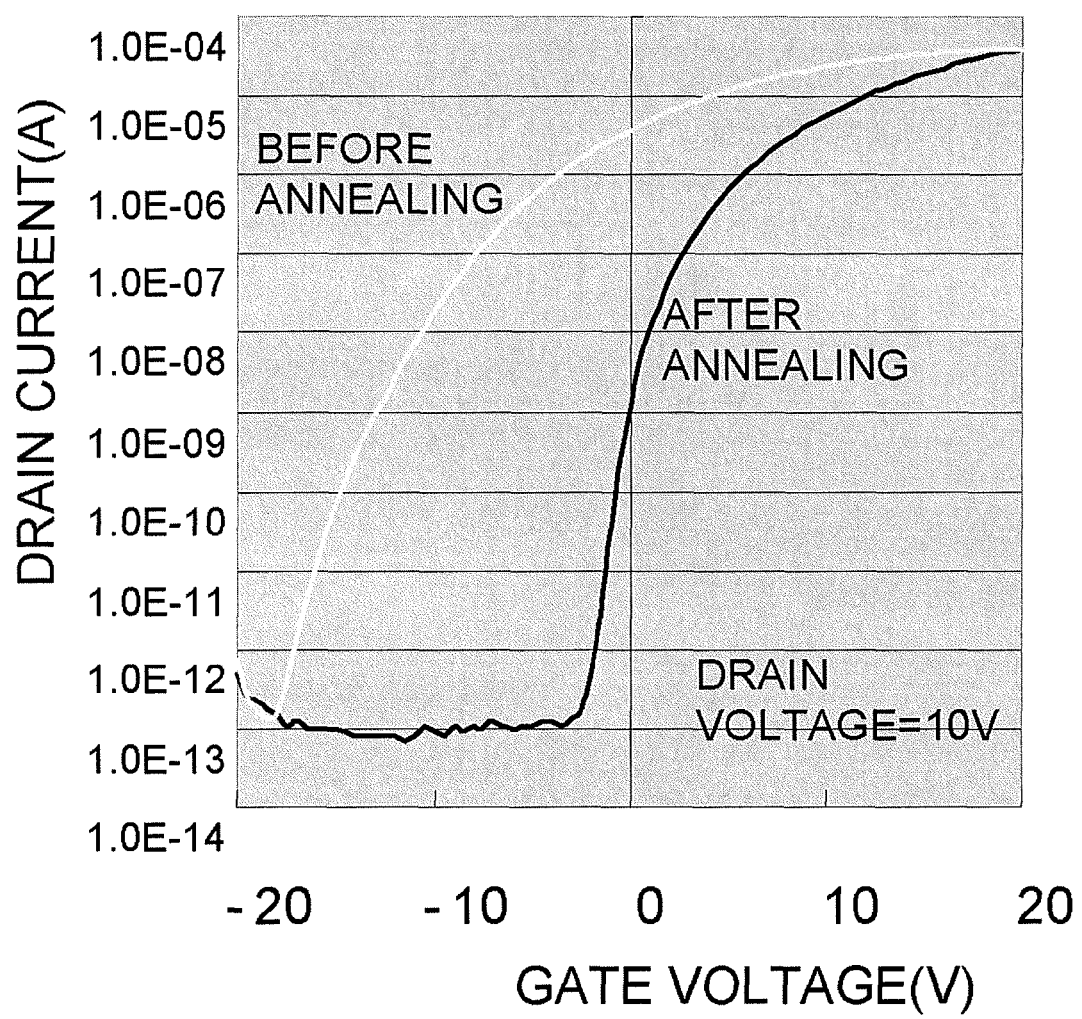
FIG. 34 is a graph showing the transmission characteristic of the oxide semiconductor TFT according to the seventh exemplary embodiment.

The TFT structure of a bottom bate structure according to a seventh exemplary embodiment and manufacturing steps thereof will be described by referring to FIG. 32 to FIG. 34.

A TFT having an interface layer in which the peak derived from In3d is shifted to a low energy side is fabricated according to the method shown in the second exemplary embodiment, and annealing processing was performed after completing the fabricating process. The annealing processing was performed on a hot plate at 300° C. for one hour in the air atmosphere.

Regarding the interface layer in which the peak derived from In3d is shifted to a low energy side, a depth profile analysis by an XPS analysis method was conducted. As a result, it is confirmed that the shift range of the peak 59 derived from In3d towards the low energy side, which was about 30 nm before performing the annealing processing (FIG. 32), was grown to about 50 nm after performing the annealing processing (FIG. 33). The layer in which the peak derived from In3d is shifted to a low energy side, i.e., the layer having a low oxygen content because oxygen of IGZO is lost, is an n+ layer that exhibits high conductivity, thereby contributing to the ohmic contact characteristic of the TFT. As described, through providing the IGZO oxygen deficit layer grown by the annealing of 300° C., the TFT with a high on-off ratio having a more stable switching characteristic raised from the vicinity of 0 V gate voltage can be achieved as shown in FIG. 34.

(Eighth Exemplary Embodiment)

Figure 35:
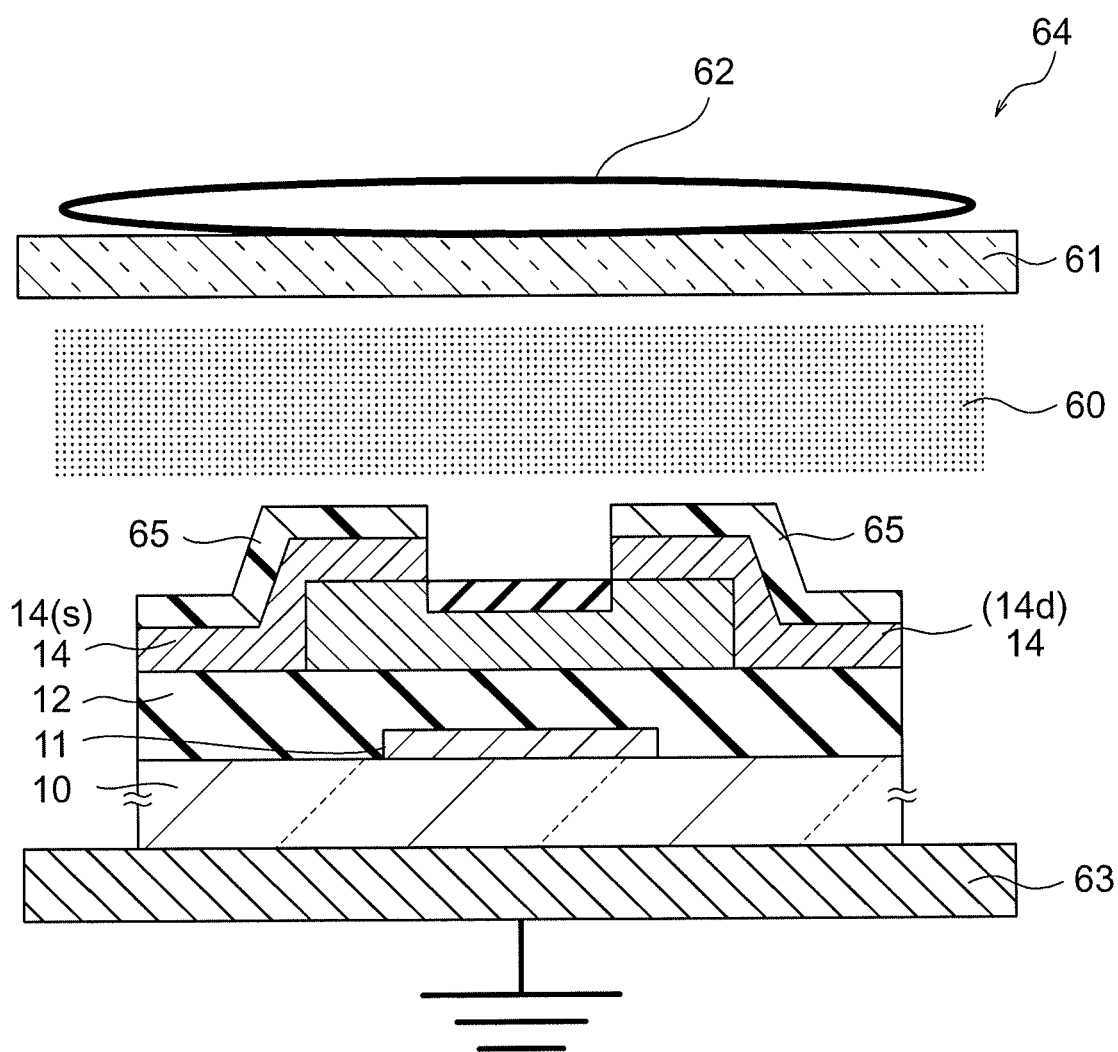
FIG. 35 is a sectional view showing a step of an oxide semiconductor TFT manufacturing method according to an eighth exemplary embodiment.

FIG. 35 shows a sectional view of a step of a TFT manufacturing method according to an eighth exemplary embodiment. The TFT manufacturing method according to the eighth exemplary embodiment includes steps of: forming a gate electrode 11 on an insulating substrate 10 as a substrate; forming a gate insulating film 12 on the gate electrode 11; forming an oxide semiconductor film 13 on the gate insulating film 12; depositing a source/drain electrode metal film on the oxide semiconductor film 13; and patterning the source/drain electrode metal film by using a plasma gas containing fluorine to form a source/drain electrode 14. Further, at the time of forming the source/drain electrode 14, a plasma gas 60 containing fluorine is generated by an inductive coupling plasma source 64, and the insulating substrate 10 is placed on an anode electrode 63 as an earth potential electrode to perform etching of the source/drain electrode metal film. FIG. 35 shows the state after completing forming of the source/drain electrode 14, in which a resist film 65 patterned in advance remains on the source/drain electrode 14. Hereinafter, the insulating substrate 10 including the gate electrode 11 and the like formed on the insulating substrate 10 is referred to as the insulating substrate 10 expediently.

The above will be described in more details. At the time of patterning the source/drain electrode 14 by performing etching by using the fluorine-based plasma gas 60, it is executed by using the inductive coupling plasma source 64 formed by the inductive coupling of the plasma gas 60 and a coil 62 placed on a window 61 constituted with glass or quartz. A high frequency voltage is applied to the coil 62.

There is no chamber wall where a large negative self-bias is generated theoretically with the inductive coupling plasma source 64, so that the plasma damage by positive ions is small regardless of the places where the insulating substrate 10 is located. In order to suppress the plasma damage to be the minimum, it is better to place the insulating substrate 10 on the anode electrode 63 as the earth potential as shown in FIG. 35. Further, high-density plasma can be easily generated with the inductive coupling plasma source 64 than the case of a conventional capacitive coupling plasma source. Thus, fluorine radicals can be formed efficiently in the plasma gas 60. Therefore, it is possible to fluoridate the surface of the oxide semiconductor film 13 efficiently and to shift the XPS peak derived from In3d of the surface layer 15 to the high energy side.

As the fluorine-based gas, it is possible to use an $SF_6$ gas, a $CF_4$ gas, a $CHF_3$ gas, an $NF_3$ gas, or the like other than those described above. Further, it is also possible to use a mixed gas acquired by mixing any of those gases or a mixed gas acquired by adding a rare gas such as Ar or He or an oxygen gas into those gases. It is desirable to set the gas pressure at the time of etching to be within a range of 0.05 to 20 Pa. The decomposition rate of the gas with the inductive coupling plasma source is higher than that of the capacitive coupling plasma source, so that a more stable generation of plasma can be achieved with a still lower gas pressure. While the exemplary embodiment is described by referring to the case of the inductive coupling plasma source using the coil, it is also possible to use an inductive coupling plasma source using a microwave such as an ECR (Electron Cyclotron Resonance) plasma source.

The thickness of the surface layer in which the peak derived from In3d of the surface of the oxide semiconductor film is shifted to the high energy side is desirable to be between 3 nm and 20 nm, inclusive. When the layer thickness is less than 3 nm, the effect of reducing the off-current and stabilizing the characteristic by suppressing the characteristic shift amount becomes small. Meanwhile, when the layer thickness exceeds 20 nm, the layer of the oxide semiconductor film functioning as the active layer becomes too thin so that the transistor characteristic, particularly the on characteristic, is deteriorated. The film thickness of the typical oxide semiconductor film of the TFT is within a range of about 30 nm to 100 nm. The layer thickness of such surface layer in which the peak derived from In3d of the surface of the oxide semiconductor film is shifted to the high energy side can be controlled by changing the plasma discharge power and discharge time at the time of plasma etching conducted by using a fluorine-based gas.

SUMMARY

In order to overcome such issues described above, the present invention provides the bottom gate type TFT in which the gate electrode, the gate insulating film, the oxide semiconductor film containing indium, and the source/drain electrode are formed on the substrate in this order, which is characterized to include, in the vicinity of the top face (the surface on the opposite side of the side in contact with the gate insulating film) of the oxide semiconductor film, the surface layer in which the peak of In is shifted to the high energy side than the peak position derived from $In_2O_3$ having a normal stoichiometry composition. That is, the present invention is the structure in which the binding energy of indium electrons on the surface layer is higher than the binding energy of indium electrons in the oxide semiconductor region existing in the lower part of the surface layer.

Such shift of the peak position to the high energy side can be acquired when indium and fluorine are chemically coupled on the surface layer. Such surface layer has an extremely high resistance value compared to that of the oxygen deficit layer, so that the off-current is not increased. Such surface layer can be achieved by etching the source/drain electrode by using fluorine-based gas plasma. Particularly, such surface layer can be formed more efficiently by generating high-density plasma by using the inductive coupling plasma source and by performing etching under a condition where radical reactions become dominant.

Further, the present invention provides the TFT which is characterized to include, in the interface between the oxide semiconductor film containing indium and the source/drain electrode metal, the surface layer in which the peak of In is shifted to the low energy side than the normal peak position derived from $In_2O_3$. That is, the present invention is the structure in which the binding energy of indium electrons on the interface layer is lower than the binding energy of indium electrons in the oxide semiconductor region existing in the lower part of the interface layer. Such interface layer has an extremely smaller resistance value compared to that of the normal oxide semiconductor film containing indium. Therefore, it is possible to acquire a fine ohmic contact in the source/drain region without individually depositing the low resistant layer unlike the case of the related techniques.

The peak shift of In described above can be checked by an XPS measurement. Specifically, it can be checked from the peak position of an In3d signal peak existing in the vicinity of 451 to 453 nm and the vicinity of 444 to 446 nm as the binding energy wavelength of the XPS data of the oxide semiconductor film containing indium.

Further, in the case where the oxide semiconductor film containing indium is an IGZO film in particular, the peak shift can be checked also from the peak position derived from a Ga2p orbital existing in the vicinity of 1116 to 1119 nm and the peak position derived from a Zn2p orbital existing in the vicinity of 1021 to 1023 nm in addition to the peak derived from the In3d orbital. Further, it can be also confirmed that indium and fluorine are chemically coupled on the surface layer of the oxide semiconductor from the peak derived from the FIs orbital existing in the vicinity of 685 nm.

By employing the present invention, a high-performance TFT can be achieved at a low cost. Specifically, a TFT with a sufficiently low off-current can be achieved. Further, when indium and fluorine are chemically coupled on the surface layer, the surface layer becomes electrically inactive (i.e., the back channel on the surface layer side becomes inactive). Thus, even when there are charged particles such as ions of impurities existing on the upper part of the surface layer, the fluctuation of the electric characteristic of the TFT becomes small. This also provides an effect of exhibiting a more stable characteristic for the external environment. The present invention makes it possible to achieve the TFT having a fine switching characteristic exhibiting an on-off ratio of five digits or more without etching the surface of the oxide semiconductor film, since generation of oxygen deficit can be suppressed through forming the surface layer containing fluorine on the surface of the oxide semiconductor film.

In other words, on the surface of the oxide semiconductor film of the TFT containing indium, the In peak position of the XPS spectrum is likely to be shifted towards the low energy side than the normal peak position derived from $In_2O_3$. Thus, how to suppress the peak shift towards the low energy side is an issue. Such shift towards the low energy side leads to an increase of the off-current and to instability of the characteristic.

Therefore, the present invention provides the TFT structure in which the In peak position is shifted towards the high energy side by employing chemical bonds of indium and fluorine into the surface layer of the oxide semiconductor film containing indium. In order to achieve the peak shift towards the high energy side efficiently, the substrate is placed on the electrode of the earth potential and the inductive coupling high-density plasma source is used when performing an etching process on the source/drain electrode by using fluorine-based gas plasma.

While the present invention has been described by referring to the specific exemplary embodiments shown in the accompanying drawings, the present invention is not limited only to each of the exemplary embodiments shown in the drawings. Any changes and modifications occurred to those skilled in the art can be applied to the structures and the details of the present invention. Further, it is to be noted that the present invention includes combinations of a part of or the entire part of each of the exemplary embodiments combined mutually in an appropriate manner.

While a part of or the entire part of the exemplary embodiments can be summarized as in following Supplementary Notes, the present invention is not necessarily limited to those structures.

(Supplementary Note 1)

A thin film device which includes a gate electrode on a substrate, a gate insulating film on the gate electrode, an oxide semiconductor film containing indium on the gate insulating film, and a source/drain electrode on the oxide semiconductor film, wherein a peak position derived from an indium 3d orbital of an XPS spectrum in a surface layer in a part of the oxide semiconductor film where the source/drain electrode is not superimposed is shifted towards a high energy side than a peak position derived from an indium 3d orbital of an XPS spectrum in an oxide semiconductor region existing in a lower part of the surface layer.

(Supplementary Note 2)

A thin film device which includes a gate electrode on a substrate, a gate insulating film on the gate electrode, an oxide semiconductor film containing indium on the gate insulating film, and a source/drain electrode on the oxide semiconductor film, wherein a peak position derived from an indium 3d orbital of an XPS spectrum in an interface layer existing between the oxide semiconductor film and the source/drain electrode is shifted towards a low energy side than a peak position derived from an indium 3d orbital of an XPS spectrum in an oxide semiconductor region existing in a lower part of the interface layer.

(Supplementary Note 3)

A thin film device which includes a gate electrode on a substrate, a gate insulating film on the gate electrode, an oxide semiconductor film containing indium on the gate insulating film, and a source/drain electrode on the oxide semiconductor film, wherein: a peak position derived from an indium 3d orbital of an XPS spectrum in a surface layer in a part of the oxide semiconductor film where the source/drain electrode is not superimposed is shifted towards a high energy side than a peak position derived from an indium 3d orbital of an XPS spectrum in an oxide semiconductor region existing in a lower part of the surface layer; and a peak position derived from an indium 3d orbital of an XPS spectrum in an interface layer existing between the oxide semiconductor film and the source/drain electrode is shifted towards a low energy side than a peak position derived from an indium 3d orbital of an XPS spectrum in an oxide semiconductor region existing in a lower part of the interface layer.

(Supplementary Note 4)

The thin film device as depicted in Supplementary Note 1 or 3, wherein the surface layer contains a chemical bond of indium and fluorine.

(Supplementary Note 5)

The thin film device as depicted in Supplementary Note 2 or 3, wherein an oxygen content of the interface layer is smaller than an oxygen content of the oxide semiconductor film existing under the interface layer.

(Supplementary Note 6)

The thin film device as depicted in Supplementary Note 3, wherein: the surface layer contains a chemical bond of indium and fluorine; and an oxygen content of the interface layer is smaller than an oxygen content of the oxide semiconductor film existing under the interface layer.

(Supplementary Note 7)

The thin film device as depicted in Supplementary Note 5 or 6, wherein the interface layer contains composition elements of the source/drain electrode.

(Supplementary Note 8)

The thin film device as depicted in any one of Supplementary Notes 1 to 7, wherein the source/drain electrode contains titanium or molybdenum.

(Supplementary Note 9)

The thin film device as depicted in any one of Supplementary Notes 1 to 8, wherein the oxide semiconductor film containing the indium contains indium, gallium, and zinc.

(Supplementary Note 10)

A thin film device manufacturing method which includes: forming a gate electrode on a substrate; forming a gate insulating film on the gate electrode; forming an oxide semiconductor film on the gate insulating film; depositing a source/drain electrode metal film on the oxide semiconductor film; and patterning the source/drain electrode metal film by using a plasma gas containing fluorine to form a source/drain electrode, wherein the plasma gas containing the fluorine is generated by an inductive coupling plasma source, and the substrate is placed on an earth potential electrode to perform etching of the source/drain electrode metal film.

(Supplementary Note 11)

The thin film device manufacturing method as depicted in Supplementary Note 10, wherein sulfur hexafluorine, tetrafluoromethane, argon, oxygen, or a mixed gas of those is used as a reaction gas of the inductive coupling plasma source.

(Supplementary Note 21)

A bottom-gate type TFT which includes a gate electrode, a gate insulating film, an oxide semiconductor film containing at least indium, and a source/drain electrode formed on a substrate in this order, wherein a peak position derived from an indium 3d orbital of an XPS spectrum in a surface layer in the vicinity of a top face (the surface on the opposite side of the side in contact with the gate insulating film) of the oxide semiconductor film in a region where the oxide semiconductor film and the source/drain electrode are not superimposed with each other is shifted towards a high energy side than a peak position derived from an indium 3d orbital of an XPS spectrum in an oxide semiconductor region existing in a lower part of the surface layer.

(Supplementary Note 22)

A bottom-gate type TFT which includes a gate electrode, a gate insulating film, an oxide semiconductor film containing at least indium, and a source/drain electrode formed on a substrate in this order, wherein a peak position derived from an indium 3d orbital of an XPS spectrum in an interface layer existing between the oxide semiconductor film and the source/drain electrode is shifted towards a low energy side than a peak position derived from an indium 3d orbital of an XPS spectrum in an oxide semiconductor region existing in a lower part of the interface layer.

(Supplementary Note 23)

A bottom-gate type TFT which includes a gate electrode, a gate insulating film, an oxide semiconductor film containing at least indium, and a source/drain electrode formed on a substrate in this order, wherein: a peak position derived from an indium 3d orbital of an XPS spectrum in a surface layer in the vicinity of a top face (the surface on the opposite side of the side in contact with the gate insulating film) of the oxide semiconductor film in a region where the oxide semiconductor film and the source/drain electrode are not superimposed with each other is shifted towards a high energy side than a peak position derived from an indium 3d orbital of an XPS spectrum in an oxide semiconductor region existing in a lower part of the surface layer; and a peak position derived from an indium 3d orbital of an XPS spectrum in an interface layer existing between the oxide semiconductor film and the source/drain electrode is shifted towards a low energy side than a peak position derived from an indium 3d orbital of an XPS spectrum in an oxide semiconductor region existing in a lower part of the interface layer.

(Supplementary Note 24)

The TFT as depicted in Supplementary Note 21 or 23, wherein the surface layer contains a chemical bond of indium and fluorine.

(Supplementary Note 25)

The TFT as depicted in Supplementary Note 22 or 23, wherein an oxygen content of the interface layer is smaller than an oxygen content of the oxide semiconductor film existing under the interface layer.

(Supplementary Note 26)

The TFT as depicted in Supplementary Note 23, wherein: the surface layer contains a chemical bond of indium and fluorine; and an oxygen content of the interface layer is smaller than an oxygen content of the oxide semiconductor film existing under the interface layer.

(Supplementary Note 27)

The TFT as depicted in Supplementary Note 25 or 26, wherein the interface layer is a structure containing composition elements of the source/drain electrode.

(Supplementary Note 28)

The TFT as depicted in any one of Supplementary Notes 21 to 27, wherein titanium or molybdenum is used as an element of the source/drain electrode.

(Supplementary Note 29)

The TFT as depicted in any one of Supplementary Notes 21 to 28, wherein the oxide semiconductor film is a structure containing at least indium, gallium, and zinc.

(Supplementary Note 30)

A TFT manufacturing method which includes: a step of forming a gate electrode by depositing a gate electrode metal film on a substrate and patterning it; a step of depositing a gate insulating film; a step of forming an island-shaped oxide semiconductor channel region by depositing an oxide semiconductor film and patterning it; and a step of forming a source/drain electrode by depositing a source/drain electrode metal film and patterning it by using a plasma gas containing fluorine, wherein the plasma gas containing the fluorine is generated by an inductive coupling plasma source, and the substrate is placed on an earth potential electrode to perform etching of the source/drain electrode metal film.

(Supplementary Note 31)

The TFT manufacturing method as depicted in Supplementary Note 30, wherein sulfur hexafluorine, tetrafluoromethane, argon, oxygen, or a mixed gas of those is used as a reaction gas of the inductive coupling plasma source (an inductive coupling type plasma etching device).

(Supplementary Note 41)
A thin film device which includes a gate electrode on a substrate, a gate insulating film on the gate electrode, an oxide semiconductor film containing indium on the gate insulating film, and a source/drain electrode on the oxide semiconductor film, wherein a peak position derived from an indium electron orbital of an XPS spectrum in a surface layer in a part of the oxide semiconductor film where the source/drain electrode is not superimposed is shifted towards a high energy side than a peak position derived from an indium electron orbital of an XPS spectrum in an oxide semiconductor region existing in a lower part of the surface layer.

(Supplementary Note 42)
A thin film device which includes a gate electrode on a substrate, a gate insulating film on the gate electrode, an oxide semiconductor film containing indium on the gate insulating film, and a source/drain electrode on the oxide semiconductor film, wherein a peak position derived from an indium electron orbital of an XPS spectrum in an interface layer existing between the oxide semiconductor film and the source/drain electrode is shifted towards a low energy side than a peak position derived from an indium electron orbital of an XPS spectrum in an oxide semiconductor region existing in a lower part of the interface layer.

(Supplementary Note 43)
A thin film device which includes a gate electrode on a substrate, a gate insulating film on the gate electrode, an oxide semiconductor film containing indium on the gate insulating film, and a source/drain electrode on the oxide semiconductor film, wherein: a peak position derived from an indium electron orbital of an XPS spectrum in a surface layer in a part of the oxide semiconductor film where the source/drain electrode is not superimposed is shifted towards a high energy side than a peak position derived from an indium electron orbital of an XPS spectrum in an oxide semiconductor region existing in a lower part of the surface layer; and a peak position derived from an indium electron orbital of an XPS spectrum in an interface layer existing between the oxide semiconductor film and the source/drain electrode is shifted towards a low energy side than a peak position derived from an indium electron orbital of an XPS spectrum in an oxide semiconductor region existing in a lower part of the interface layer. The possibilities of industrial use of the present invention may be pixel drive elements of flat panel displays such as a liquid crystal display, an organic EL display, and an electronic paper. In particular, through controlling the oxide semiconductor surface layer by using the present invention, it is possible to acquire a TFT in which the electric characteristics such as the off-current and the threshold voltage are more minutely controlled compared to the case of the related techniques using the oxide semiconductor. Therefore, the present invention can be utilized not only for the pixel drive element but also for a high-performance circuit such as a logic circuit formed by having an inverter as the base.

Furthermore, the present invention can be used not only for the display as described above but also for high pressure-resistance power device which utilizes a high drain pressure-resistance of the TFT and to a thermoelectric conversion device which utilizes a high thermoelectromotive power of the oxide semiconductor film.

What is claimed is:
1. A thin film device manufacturing method, comprising: forming a gate electrode on a substrate; forming a gate insulating film on the gate electrode; forming an oxide semiconductor film on the gate insulating film; depositing a source/drain electrode metal film on the oxide semiconductor film; and patterning the source/drain electrode metal film by using a plasma gas containing fluorine to form a source/drain electrode, wherein
the plasma gas containing the fluorine is generated by an inductive coupling plasma source, and the substrate is placed on an earth potential electrode to perform etching of the source/drain electrode metal film.
2. The thin film device manufacturing method as claimed in claim 1, wherein
sulfur hexafluorine, tetrafluoromethane, argon, oxygen, or a mixed gas of those is used as a reaction gas of the inductive coupling plasma source.
3. The thin film device manufacturing method as claimed in claim 1, further comprising:
placing the substrate on an earth potential electrode to perform etching of the source/drain electrode metal film while fluoridating a surface layer in a part of the oxide semiconductor film where the source/drain electrode is not superimposed; and
shifting a peak position derived from an indium 3d orbital of an XPS spectrum in the surface layer towards a high energy side than a peak position derived from an indium 3d orbital of an XPS spectrum in an oxide semiconductor region existing in a lower part of the surface layer.

* * * * *